(12) United States Patent
Qiao et al.

(10) Patent No.: US 10,510,747 B1
(45) Date of Patent: Dec. 17, 2019

(54) BCD SEMICONDUCTOR DEVICE AND METHOD FOR MANUFACTURING THE SAME

(71) Applicant: University of Electronic Science and Technology of China, Chengdu (CN)

(72) Inventors: Ming Qiao, Chengdu (CN); Chunlan Lai, Chengdu (CN); Linrong He, Chengdu (CN); Li Ye, Chengdu (CN); Bo Zhang, Chengdu (CN)

(73) Assignee: UNIVERSITY OF ELECTRONIC SCIENCE AND TECHNOLOGY OF CHINA, Chengdu (CN)

(*) Notice: Subject to any disclaimer, the term of this patent is extended or adjusted under 35 U.S.C. 154(b) by 0 days.

(21) Appl. No.: 16/140,572

(22) Filed: Sep. 25, 2018

(30) Foreign Application Priority Data

Aug. 22, 2018 (CN) .......................... 2018 1 0958772

(51) Int. Cl.
| | |
|---|---|
| *H01L 27/06* | (2006.01) |
| *H01L 29/06* | (2006.01) |
| *H01L 29/739* | (2006.01) |
| *H01L 29/78* | (2006.01) |
| *H01L 29/08* | (2006.01) |
| *H01L 21/768* | (2006.01) |
| *H01L 21/3115* | (2006.01) |
| *H01L 21/324* | (2006.01) |

(52) U.S. Cl.
CPC .... *H01L 27/0623* (2013.01); *H01L 21/31155* (2013.01); *H01L 21/324* (2013.01); *H01L 21/76831* (2013.01); *H01L 27/0629* (2013.01); *H01L 29/0649* (2013.01); *H01L 29/0696* (2013.01); *H01L 29/086* (2013.01); *H01L 29/0808* (2013.01); *H01L 29/0821* (2013.01); *H01L 29/0878* (2013.01); *H01L 29/7393* (2013.01); *H01L 29/7818* (2013.01)

(58) Field of Classification Search
CPC ........................ H01L 27/0623; H01L 29/0696
See application file for complete search history.

(56) References Cited

U.S. PATENT DOCUMENTS 5,156,989 A * 10/1992 Williams .............. H01L 21/761
148/DIG. 85

FOREIGN PATENT DOCUMENTS

CN          101452933 A      6/2009

* cited by examiner

*Primary Examiner* — Quoc D Hoang
(74) *Attorney, Agent, or Firm* — Gokalp Bayramoglu

(57) ABSTRACT

A BCD semiconductor device includes devices integrated on a single chip. The devices include a first high voltage nLIGBT device, a second high voltage nLIGBT device, a first high voltage nLDMOS device, a second high voltage nLDMOS device, a third high voltage nLDMOS device, a first high voltage pLDMOS device and low voltage NMOS, PMOS and PNP devices, and a diode device. A dielectric isolation is applied to the high voltage nLIGBT, nLDMOS and pLDMOS devices to realize a complete isolation between the high and low voltage devices. The nLIGBT, nLDMOS, NPN and low voltage NMOS and PMOS are integrated on the substrate of a single chip. The isolation region composed of the dielectric, the second conductivity type buried layer, the dielectric trench, and the first conductivity type implanted region realizes full dielectric isolation of high and low voltage devices. The six types of high voltage transistors have multiple channels.

20 Claims, 12 Drawing Sheets

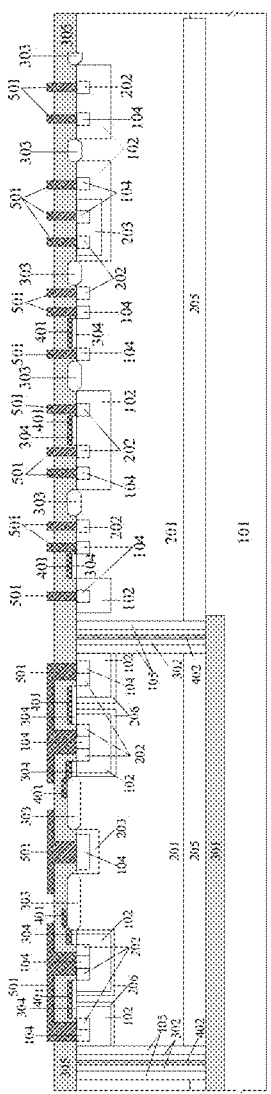
FIG. 9 (m)
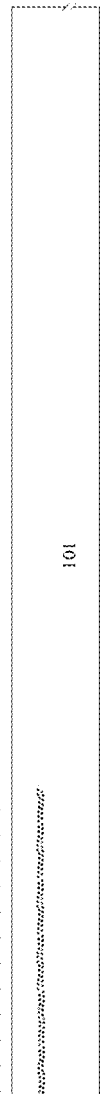
FIG. 10 (a)
FIG. 10 (b)
FIG. 10 (c)

BCD SEMICONDUCTOR DEVICE AND METHOD FOR MANUFACTURING THE SAME

CROSS REFERENCE TO RELATED APPLICATIONS

This application is based upon and claims priority to Chinese Patent Application No. 2018109587724, filed on Aug. 22, 2018, the entire content of which is incorporated herein by reference.

TECHNICAL FIELD

The present invention pertains to the technical field of semiconductor power devices, and relates to a BCD (Bipolar CMOS DMOS) device and a method for manufacturing the same.

BACKGROUND

Because of the high precision of bipolar transistors in analog applications, high-integration of CMOS, and high power or voltage characteristic of DMOS (Double-diffused MOSFET), generally, bipolar analog circuits, CMOS logic circuits, CMOS analog circuits and DMOS high-voltage power devices are integrated into a single chip (BCD process for short) of a high voltage power integrated circuit. Lateral high-voltage devices are widely used in high-voltage power integrated circuits because the drain terminal, gate terminal and source terminal of the lateral high-voltage devices are all on the chip surface and are easy to be integrated with low-voltage signal circuits through internal connections. In general, high voltage LDMOS devices (Lateral Double-diffused MOSFETs) are used as output stages in power integrated chips. However, the relationship between a specific on-resistance ($R_{on,\ sp}$) and breakdown voltage (BV) of a DMOS device is $R_{on,\ sp} \propto BV^{2.3-2.6}$ under simple one-dimensional analysis. As a result, the turn-on resistance of the device increases sharply in high voltage applications, which limits the application of lateral high voltage DMOS devices in high voltage power integrated circuits, especially in circuits requiring low turn-on loss and small chip size. In order to solve the problem of high turn-on resistance, J. A. APPLES et al. proposed RESURF (Reduced SURface Field) technology to reduce the surface field, which is widely used in the design of high-voltage devices. In addition, concepts such as Double-RESURF, Triple-RESURF LDMOS devices and Insulated-Gate Bipolar Transistor (IGBT) and other similar devices have also been proposed by others. Based on RESURF voltage sustaining principle, the inventor's invention of BCD semiconductor device and manufacturing technique thereof (patent number: ZL200810148118.3) has been patented. In the invention, nLIGBT, nLDMOS, low voltage NMOS, low voltage PMOS and low voltage NPN are monolithically integrated on a single crystal substrate to obtain well-performed power devices with high voltage, high speed, and low turn-on loss. Since no epitaxial process is used, the chip has a lower manufacturing cost.

SUMMARY

In view of the above-mentioned deficiencies of the prior art, the objective of the present invention is to provide a BCD semiconductor device and a method for manufacturing the same.

In order to realize the above-mentioned objective of the present invention, the technical solution of the present invention is as follows.

1. A BCD semiconductor device, includes devices integrated on a single chip. The devices include a first high voltage nLIGBT device 1, a second high voltage nLIGBT device 2, a first high voltage nLDMOS device 3, a second high voltage nLDMOS device 4, a third high voltage nLDMOS device 5, a first high voltage pLDMOS device 6, a low voltage NMOS device 7, a low voltage PMOS device 8, a PNP device 9, and a diode device 10. A dielectric isolation is applied to the first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6 to achieve a complete isolation between high voltage devices and low voltage devices. A multi-channel design is applied to the first high voltage nLIGBT device 1, the second high voltage nLIGBT device 2, the first high voltage nLDMOS device 3, the second high voltage nLDMOS device 4, and the third high voltage nLDMOS device 5.

Preferably, the BCD semiconductor device further includes the following features.

The first high voltage nLIGBT device 1 is located in an isolation region. The isolation region includes a dielectric 301, a second conductivity type buried layer 205, a dielectric trench 302, a filler 402, and a first conductivity type implanted region 105. The dielectric 301 is located in a substrate 101. The dielectric trench 302 is located in a second conductivity type epitaxial layer 201, extends to the substrate 101, and is connected to the dielectric 301 to form a complete isolation. The first conductivity type implanted region 105 is located on each side of the dielectric trench 302, and the filler 402 is located in the middle of the dielectric trench 302. The second conductivity type buried layer 205 is located above the dielectric 301. The first high voltage nLIGBT device 1 further includes a multi-channel emitter terminal located on each side of the device. The multi-channel emitter terminal includes a plurality of cells alternately arranged according to an order of a left cell 2 (0), a first right cell 1 (1), a first left cell 2 (1), a second right cell 1 (2), a second left cell 2 (2) . . . a $n^{th}$ right cell 1 (n), a $n^{th}$ left cell 2 (n) . . . . The first high voltage nLIGBT device 1 further includes a drift region consisting of the second conductivity type epitaxial layer 201, a collector terminal consisting of a first conductivity type contact region 103 formed by directly connecting a second conductivity type buffer region 203 and a metal layer 501, a field oxide layer 303 located on a surface of the second conductivity type epitaxial layer 201, the metal layer 501, and pre-metal dielectric layer 305. Each cell of the emitter terminal includes a second conductivity type well region 206, a first conductivity type region 102 located in the second conductivity type well region 206, a first conductivity type contact region 103 directly connected to the metal layer 501 and located in the first conductivity type region 102, a second conductivity type contact region 202, and a thin dielectric layer 304 and a gate terminal 401 located on an upper surface of the first conductivity type region 102.

A difference between the second high voltage nLIGBT device 2 and the first high voltage nLIGBT device 1 is that the multi-channel emitter terminal of the second high voltage nLIGBT device 2 includes a plurality of cells alternately arranged according to an order of a first right cell 1 (1), a first left cell 2 (1), a second right cell 1 (2), a second left cell 2 (2), . . . a $n^{th}$ right cell 1 (n), a $n^{th}$ left cell 2 (n) . . . .

The first high voltage nLDMOS device 3 is located in an isolation region. The isolation region includes a dielectric 301, a second conductivity type buried layer 205, a dielectric trench 302, a filler 402, and a first conductivity type implanted region 105. The dielectric 301 is located in a substrate 101. A dielectric trench 302 is located in a second conductivity type epitaxial layer 201, extends to the substrate 101, and is connected to the dielectric 301 to form a complete isolation. A first conductivity type implanted region 105 is located on each side of the dielectric trench 302. The filler 402 is located in the middle of the dielectric trench 302. A second conductivity type buried layer 205 is located above the dielectric 301. The first high voltage nLDMOS device 3 further includes a multi-channel source terminal located on both side of the device. The multi-channel source terminal includes a plurality of cells alternately arranged according to an order of a left cell 2 (0), a first right cell 1 (1), a first left cell 2 (1), a second right cell 1 (2), a second left cell 2 (2), . . . a n$^{th}$ right cell 1 (n), a n$^{th}$ left cell 2 (n) . . . . The first high voltage nLDMOS device 3 further includes a drift region consisting of the second conductivity type epitaxial layer 201, a drain terminal consisting of a second conductivity type contact region 202 formed by directly connecting a second conductivity type buffer region 203 and a metal layer 501, a field oxide layer 303 located on a surface of the second conductivity type epitaxial layer 201, the metal layer 501 and a pre-metal dielectric layer 305. Each cell of the source terminal includes a second conductivity type well region 206, a first conductivity type region 102 located in the second conductivity type well region 206, a first conductivity type contact region 103 directly connected to the metal layer 501 and located in the first conductivity type region 102, a second conductivity type contact region 202, and a thin dielectric layer 304 and a gate terminal 401 located on an upper surface of the first conductivity type region 102.

The second high voltage nLDMOS device 4 is different from the first high voltage nLDMOS device 3 in that a second conductivity type implanted region 207 is arranged between the thin dielectric layer 304 and an upper surface of the second conductivity type well region 206.

The third high voltage nLDMOS device 5 is different from the first high voltage nLDMOS device 3 in that no field oxide layer 303 is arranged on a surface of the second the conductivity type epitaxial layer 201.

The first high voltage pLDMOS device 6 is located at an isolation region. The isolation region includes a dielectric 301, a second conductivity type buried layer 205, a dielectric trench 302, a filler 402, and a first conductivity type implanted region 105. The dielectric 301 is located in a substrate 101. A dielectric trench 302 is located in a second conductivity type epitaxial layer 201, extends to the substrate 101, and is connected to the dielectric 301 to form a complete isolation. A first conductivity type implanted region 105 is located on each side of the dielectric trench 302. The filler 402 is located in the middle of the dielectric trench 302. A second conductivity type buried layer 205 is located above the dielectric 301. The first high voltage pLDMOS device 6 further includes: a source terminal formed by left cells 2 (0) located on both sides of the device, a drift region consisting of a first conductivity type region 102 located in a second conductivity type epitaxial layer 201, a drain terminal consisting of a first conductivity type contact region 103 located in a first conductivity type region 102, a field oxide layer 303 located above the second conductivity type epitaxial layer 201, a metal layer 501, and a pre-metal dielectric layer 305. The left cell 2 (0) constituting the source terminal includes a second conductivity type well region 206, another first conductivity type contact region 103 and a second conductivity type contact region 202 located in the second conductivity type well region 206 and directly connected to the metal layer 501, and a thin dielectric layer 304 and a gate terminal 401 located on an upper surface of the second conductivity type well region 206.

The low voltage NMOS device 7 is arranged in a first conductivity type region 102. The first conductivity type region 102 is located in a second conductivity type epitaxial layer 201. A second conductivity type contact region 202 and one of a first conductivity type contact region 103 serve as a source terminal and are located at a side of the first conductivity type region 102 and respectively connected to a metal layer 501. Another first conductivity type contact region 103 serves as a drain terminal and is located at the other side of the first conductivity type region 102 and connected to the metal layer 501. A gate terminal 401 is located above the thin dielectric layer 304 and below the dielectric layer 305 in front of the metal layer 501. The gate terminal 401 and the metal layer 501 are isolated from each other through the dielectric layer 305 in front of the metal layer 501.

The low voltage PMOS device 8 is arranged in a second conductivity type well region 206. The second conductivity type well region 206 is located in a second conductivity type epitaxial layer 201. A second conductivity type contact region 202 and one of a first conductivity type contact region 103 serve as a source terminal and are located at a side of a first conductivity type region 102 and connected to a metal layer 501. Another first conductivity type contact region 103 serves as a drain terminal is located at the other side of the first conductivity type region 102 and connected to the metal layer 501. A gate terminal 401 is located above a thin dielectric layer 304 and below a pre-metal dielectric layer 305. The metal layer 501 is isolated with the gate terminal 401 through the pre-metal dielectric layer 305.

The PNP device 9 is arranged in a first conductivity type region 102 and below a pre-metal dielectric layer 305. A collector terminal of a first conductivity type contact region 103 is located in the first conductivity type region 102. An emitter terminal of the first conductivity type contact region 103 and a base terminal of a second conductivity type contact region 202 are located in a base region of a second conductivity type buffer region 203. The second conductivity type buffer region 203 is located in the first conductivity type region 102. The collector terminal of the first conductivity type contact region 103, the emitter terminal of the first conductivity type contact region 103, and the base terminal of the second conductivity type contact region 202 are all connected to a metal layer 501.

The diode device 10 is arranged in a first conductivity type region 102 and below a pre-metal dielectric layer 305. An anode of a first conductivity type contact region 103 is located in the first conductivity type region 102. A cathode of a second conductivity type contact region 202 is located in the first conductivity type region 102. The anode of the first conductivity type contact region 103 and the cathode of the second conductivity type contact region 202 are connected to a metal layer 501.

Preferably, the BCD semiconductor device further includes the following features. The second conductivity type buried layer 205 above the dielectric 301 of the first high voltage nLIGBT device 1, the second high voltage nLIGBT device 2, the first high voltage nLDMOS device 3, the second high voltage nLDMOS device 4, the third high voltage nLDMOS device 5, the first high voltage pLDMOS device 6 are replaced with a first conductivity type voltage withstanding structure 106. The first conductivity type voltage withstanding structure 106 is connected to the first conductivity type implanted region 105 on a side wall of the dielectric trench 302.

Preferably, the BCD semiconductor device further includes the following features. The first conductivity type implanted regions 105 on the left and right sides of the side walls of the dielectric trenches 302 of the first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6 are replaced with a second conductivity type dielectric electric field enhancement structure 208.

Preferably, the BCD semiconductor device further includes the following features. The first conductivity type implanted regions 105 on the left and right sides of the side walls of the dielectric trenches 302 of the first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6 are replaced with the second conductivity type dielectric electric field enhancement structure 208, and at the same time the second conductivity type buried layers 205 above the dielectrics 301 are replaced with the first conductivity type voltage withstanding structures 106.

Preferably, the BCD semiconductor device further includes the following features. For the structure of the emitter terminal of the first high voltage nLIGBT device 1 and the structure of the source terminals of the first high voltage nLDMOS device 3, the second high voltage nLDMOS device 4, the third high voltage nLDMOS device 5, the first high voltage pLDMOS device 6, when the device ends with the $n^{th}$ left cell 2 ($n$) at the edge, the number of the channels is 2n+1; when n=0, the device is a single-channel device; when the device ends with the $n^{th}$ right cell 1 ($n$) at the edge, the number of the channels is 2n and n≥1. For the structure of the emitter terminal of the second high voltage nLIGBT device 2, when the device ends with the $n^{th}$ left cell 2 ($n$) at the edge, the number of the channels is 2n and n≥1, when the device ends with the $n^{th}$ right cell 1 ($n$) at the edge, the number of the channels is 2n+1, and when n=0, the device is a single-channel device.

Preferably, the BCD semiconductor device further includes the following features. The structures of emitter terminals of the first high voltage nLIGBT device 1 and the second high voltage nLIGBT device 2 and the structures of source terminals of the third high voltage nLDMOS device 5 and the first high voltage pLDMOS device 6 further include a second conductivity type implanted region 207 located between the thin dielectric layer 304 and an upper surface of the second conductivity type well region 206. In this case, the above-mentioned high voltage devices pertain to depletion type devices.

Preferably, the BCD semiconductor device further includes the following features. There is no left cell 2 (0) in the structure of the emitter terminal of the first high voltage nLIGBT device 1 and the structures of the source terminals of the first high voltage nLDMOS device 3, the second high voltage nLDMOS device 4, the third high voltage nLDMOS device 5, and the first high voltage pLDMOS device 6.

Preferably, the BCD semiconductor device further includes the following features. There is no second conductivity type well region 206 in the first high voltage nLIGBT device 1, the second high voltage nLIGBT device 2, the first high voltage nLDMOS device 3, the second high voltage nLDMOS device 4, and the third high voltage nLDMOS device 5.

Preferably, the BCD semiconductor device further includes the following features. The first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6 have no first conductivity type implanted region 105 on two sides of the dielectric trench 302 and no second conductivity type buried layer 205 above the dielectric 301.

Preferably, the BCD semiconductor device further includes the following features. In the first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6, the filler 402 in the dielectric trench 302 is polysilicon, silicon dioxide, or air.

Preferably, the BCD semiconductor device further includes the following features. The first conductivity type regions 102 and the second conductivity type well regions 206 of the first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6 contact the substrate 101 or the dielectric 301. In this case, these devices are single-channel devices.

Preferably, the BCD semiconductor device further includes the following features. The high voltage devices are arranged inside a dielectric island, or the low voltage devices are arranged inside an isolation island in a manner of dielectric isolation.

Preferably, the BCD semiconductor device further includes the following features. The gate terminal 401 has a trench gate structure.

2. In order to achieve the above-mentioned objective, the present invention further provides a method for manufacturing the BCD semiconductor device, which includes the following steps.

Step 1, oxygen ions with a predetermined amount is implanted into a substrate 101 through a photolithography technique and an ion implantation technique, then an annealing treatment is performed to form a dielectric 301.

Step 2, second conductivity type impurities are implanted into the substrate 101 through the photolithography technique and the ion implantation technique.

Step 3, an epitaxy is performed to form a second conductivity type epitaxial layer 201. Meanwhile, a second conductivity type buried layer 205 above the dielectric 301 is formed in a high temperature process of the epitaxy.

Step 4, a deep trench is etched after a shield layer is etched on an upper electrode of the second conductivity type epitaxial layer 201 through the photolithography technique and an etching technique, and a first conductivity type implanted region 105 is formed on a side wall of the deep trench in a manner of inclined angle implantation.

Step 5, an oxide layer is thermally grown on the side wall of the trench and an upper surface of the second conductivity type epitaxial layer 201, a dielectric trench 302 is formed, a polysilicon is deposited to fill the remaining gaps in the deep trench, and the polysilicon on the upper surface of second conductivity type epitaxial layer 201 is removed, an active region is formed after the photolithography technique and the etching technique.

Step 6, first conductivity type impurities and second conductivity type impurities are respectively implanted into the second conductivity type epitaxial layer 201 by different energies through the photolithography technique and the ion implantation technique, then the annealing treatment is performed to form a first conductivity type region 102 and a second conductivity type well region 206.

Step 7, the active region is formed by photolithographing, and a field oxide layer 303 is thermally grown on the upper surface of the second conductivity type epitaxial layer 201.

Step 8, the second conductivity type impurities are implanted into the second conductivity type epitaxial layer 201 through the photolithography technique and the ion implantation technique, then an annealing treatment is performed to form a second conductivity type buffer region 203.

Step 9, a thin dielectric layer 304 is formed through a thermal oxidation growth, the polysilicon is deposited, the photolithography and the ion implantation are performed, so that a first conductivity type contact region 103 and a second conductivity type contact region 202 are formed.

Step 10, a pre-metal dielectric layer 305 is deposited, and a metal layer 501 is deposited after punching.

Preferably, the BCD semiconductor device further includes the following features. An annealing process is added between step 3 and step 4 to ensure a formation of the second conductivity type buried layer 205. In step 6, the trench is filled through a method of deposition first, and the growth of the field oxide layer is performed subsequently.

3. In order to achieve the above-mentioned objective, the present invention provides a BCD semiconductor device, which includes devices integrated on a single chip. The devices include a third high voltage nLIGBT device 11, a fourth high voltage nLDMOS device 12, a fifth high voltage nLDMOS device 13, a sixth high voltage nLDMOS device 14, a second high voltage pLDMOS device 15, a second low voltage PMOS device 16, a second low voltage NMOS device 17, an NPN device 18, a second PNP device 19, and a second diode device 20. A dielectric isolation is applied to the third high voltage nLIGBT device 11, the fourth high voltage nLDMOS device 12, the fifth high voltage nLDMOS device 13, the sixth high voltage nLDMOS device 14, and the second high voltage pLDMOS device 15 to realize a complete isolation between the high voltage devices and the low voltage devices. As shown in FIG. 7, preferably, the BCD semiconductor device further includes the following features.

The third high voltage nLIGBT device 11 is located in an isolation region. The isolation region includes a dielectric 301, a first conductivity type voltage withstanding structure 106, a dielectric trench 302, a filler 402, and a first conductivity type implanted region 105. The dielectric 301 is located in a substrate 101. The dielectric trench 302 is located in a first conductivity type epitaxial layer 104, extends to the substrate 101, and is connected to the dielectric 301 to form a complete isolation. The first conductivity type implanted region 105 is located on each side of the dielectric trench 302. The filler 402 is located in the middle of the dielectric trench 302. The first conductivity type voltage withstanding structure 106 is located above the dielectric 301. The third high voltage nLIGBT device 11 further includes: a second conductivity type well region 206 located in a first conductivity type epitaxial layer 104, wherein the second conductivity type well region 206 serves as a drift region; a second conductivity type buffer region 203 located in the second conductivity type well region 206, wherein the second conductivity type buffer region 203 serves as a field stop region; a first conductivity type contact region 103 located in a second conductivity type buffer region 203 and connected to a metal layer 501, wherein the first conductivity type contact region 103 serves as a collector terminal; a field oxide layer 303 located above the second conductivity type well region 206; a gate terminal 401 and a thin dielectric layer 304 located on a side of the field oxide layer 303 near an emitter terminal, and on an upper surface of the first conductivity type region 102; another first conductivity type contact region 103 and a second conductivity type contact region 202 located on a side of the gate terminal 401 far away from the field oxide layer 303 and connected to the metal layer 501. The metal layer 501 is isolated with the gate terminal 401 through a pre-metal dielectric layer 305.

The fourth high voltage nLDMOS device 12 is located in an isolation region. The isolation region includes a dielectric 301, a first conductivity type voltage withstanding structure 106, a dielectric trench 302, a filler 402, and a first conductivity type implanted region 105. The dielectric 301 is located in a substrate 101. A dielectric trench 302 is located in a first conductivity type epitaxial layer 104, extends to the substrate 101, and is connected to the dielectric 301 to form a complete isolation. A first conductivity type implanted region 105 is located on each side of the dielectric trench 302. The filler 402 is located in the middle of the dielectric trench 302. The first conductivity type voltage withstanding structure 106 is located above the dielectric 301. The fourth high voltage nLDMOS device 12 further includes: a second conductivity type well region 206 located in a first conductivity type epitaxial layer 104, wherein the second conductivity type well region 206 serves as a drift region; a second conductivity type buffer region 203 located in a second conductivity type well region 206, wherein the second conductivity type buffer region 203 serves as a field stop region; a second conductivity type contact region 202 located in a second conductivity type buffer region 203 and connected to a metal layer 501, wherein the second conductivity type contact region 202 serves as a drain terminal; a field oxide layer 303 located above the second conductivity type well region 206; a gate terminal 401 and a thin dielectric layer 304 located on a side of the field oxide layer 303 near a source terminal and on an upper surface of a first conductivity type region 102; a first conductivity type contact region 103 and another second conductivity type contact region 202 located on a side of the gate terminal 401 far away from the field oxide layer 303 and connected to the metal layer 501. The metal layer 501 is isolated with the gate terminal 401 through a pre-metal dielectric layer 305.

The fifth high voltage nLDMOS device 13 is different from the fourth high voltage nLDMOS device 12 in that the second conductivity type implanted region 207 is located on an upper surface of the first conductivity type region 102, and the gate terminal 401 and the thin dielectric layer 304 are located on an upper surface of the second conductivity type implanted region 207.

The sixth high voltage nLDMOS device 14 is different from the fourth high voltage nLDMOS device 12 in that no field oxide layer 303 is arranged above the second conductivity type well region 206.

The second high voltage pLDMOS device 15 is located in an isolation region. The isolation region includes a dielectric 301, a second conductivity type buried layer 205, a dielectric trench 302, a filler 402, and a first conductivity type implanted region 105. The dielectric 301 is located in a substrate 101. A dielectric trench 302 is located in a first conductivity type epitaxial layer 104, extends to the substrate 101 and is connected to the dielectric 301 to form a complete isolation. The first conductivity type implanted region 105 is located on each side of the dielectric trench 302. The filler 402 is located in the middle of the dielectric trench 302. The second conductivity type buried layer 205 is located above the dielectric 301. The second high voltage pLDMOS device 15 further includes: a first conductivity type contact region 103 located in the first conductivity type epitaxial layer 104 and connected to a metal layer 501, wherein the first conductivity type contact region 103 serves as a drain terminal; a gate terminal 401 and a thin dielectric layer 304 located on an upper surface of a second conductivity type well region 206; a field oxide layer 303 located on an upper surface of the first conductivity type epitaxial layer 104 and between the second conductivity type well region 206 and the first conductivity type contact region 103; another first conductivity type contact region 103 and a second conductivity type contact region 202 located on a side of the gate terminal 401 far away from the field oxide layer 303 and respectively connected to the metal layer 501. The metal layer 501 is isolated with the gate terminal 401 through a pre-metal dielectric layer 305.

The second low voltage PMOS device 16 is arranged in a second conductivity type well region 206, and the second conductivity type well region 206 is located in a first conductivity type epitaxial layer 104. A second conductivity type contact region 202 and a first conductivity type contact region 103 are respectively connected to a metal layer 501 to serve as source terminals and are located on a side inside the second conductivity type well region 206. Another first conductivity type contact region 103 is connected to a metal layer 501 to serve as a drain terminal. Another gate terminal inside the second conductivity type well region 206 is located above a thin dielectric layer 304 and below a pre-metal dielectric layer 305. The gate terminal 401 and the metal layer 501 are isolated from the gate terminal 4011 through the pre-metal dielectric layer 305.

The second low voltage NMOS device 17 is arranged inside a first conductivity type region 102, and the first conductivity type region 102 is located in a first conductivity type epitaxial layer 104. A second conductivity type contact region 202 and a first conductivity type contact region 103 are respectively connected to a metal layer 501 to serve as source terminals and are located on a side inside the first conductivity type region 102. Another second conductivity type contact region 202 is connected to the metal layer 501 to serve as a drain terminal and is located on another side inside the first conductivity type region 102. The gate terminal 401 is located above a thin dielectric layer 304 and below a pre-metal dielectric layer 305. The gate terminal 401 is isolated with the metal layer 501 through the pre-metal dielectric layer 305.

The NPN device 18 is arranged in a second conductivity type well region 206 and below a pre-metal dielectric layer 305. A collector terminal of a second conductivity type contact region 202 is located in the second conductivity type well region 206. An emitter terminal of the second conductivity type contact region 202 and a base terminal of a first conductivity type contact region 103 are located in a base region of a first conductivity type region 102. The emitter terminal of the second conductivity type contact region 202, the collector terminal of the second conductivity type contact region 202, and the base terminal of the first conductivity type contact region 103 are all connected to a metal layer 501.

The second PNP device 19 is arranged in a first conductivity type epitaxial layer 104 and below a pre-metal dielectric layer 305. A collector terminal and an emitter terminal of a first conductivity type contact region 103 are located in a first conductivity type region 102, respectively. A base terminal of a second conductivity type contact region 202 is located in a base region of a second conductivity type well region 206. The first conductivity type region 102 is also located in the second conductivity type well region 206. The collector terminal of the first conductivity type contact region 103, the emitter terminal of the first conductivity type contact region 103, and the base terminal of the second conductivity type region 202 are all connected to a metal layer 501.

The second diode device 20 is arranged in a second conductivity type well region 206 and below a pre-metal dielectric layer 305. An anode of a first conductivity type contact region 103 is located in a second conductivity type well region 206 and a cathode of a second conductivity type contact region 202 is also located in the second conductivity type well region 206. The anode of the first conductivity type contact region 103 and the cathode of the second conductivity type contact region 202 are connected to a metal layer 501.

4. In order to achieve the above-mentioned objective, the present invention further provides a method for manufacturing the BCD semiconductor device which includes the following steps.

Step 1, oxygen ions with a predetermined amount is implanted into a substrate 101 and then an annealing treatment is performed to form a dielectric 301 through a photolithography technique and an ion implantation technique.

Step 2, first conductivity type impurities are implanted into the substrate 101 through the photolithography technique and the ion implantation technique.

Step 3, an epitaxy is performed to form a first conductivity type epitaxial layer 104. Meanwhile, a first conductivity type voltage withstanding structure 106 above the dielectric 301 is formed in a high temperature annealing process.

Step 4, a deep trench is etched after a shield layer is etched on an upper electrode of the first conductivity type epitaxial layer 104 through the photolithography technique and an etching technique, and a first conductivity type implanted region 105 is formed on a side wall of the deep trench in a manner of inclined angle implantation.

Step 5, an oxide layer is thermally grown on the side wall of the trench and an upper surface of the first conductivity type epitaxial layer 104, a dielectric trench 302 is formed, a polysilicon is deposited to fill remaining gaps in the deep trench, and the polysilicon and oxide layer on an upper surface of a first conductivity type epitaxial layer 104 is removed through CMP.

Step 6, first conductivity type impurities and second conductivity type impurities are respectively implanted into the first conductivity type epitaxial layer 104 by different energies through the photolithography technique and the ion implantation technique, then the annealing treatment is performed to form a first conductivity type region 102 and a second conductivity type well region 206.

Step 7, an active region is formed by photolithographing, and an oxide layer is thermally grown on the upper surface of the first conductivity type epitaxial layer 104 to form a field oxide layer 303, and a photoresist is removed.

Step 8, the second conductivity type impurities are implanted into the first conductivity type epitaxial layer 104 through the photolithography technique and the ion implantation technique, then an annealing treatment is performed to form a second conductivity type buffer region 203, a thin dielectric layer 304 is formed through a thermal oxidation growth, a gate terminal 401 is formed by deposition, and a photoetching is performed.

Step 9, the photolithography and the ion implantation are performed to form a first conductivity type contact region 103 and a second conductivity type contact region 202.

Step 10, a pre-metal dielectric layer 305 is deposited, and a metal layer 501 is deposited after punching.

Preferably, an annealing process is added between step 3 and step 4 to ensure a formation of the first conductivity type voltage withstanding structure 106. In step 6, the trench is filled in the method of deposition first, and the growth of the field oxide layer is performed, subsequently.

The present invention has the following advantages. According to the present invention, a monolithic integration of nLIGBT, nLDMOS, low voltage NMOS, low voltage PMOS, and low voltage NPN on the substrate can be realized. In one aspect, the isolation region constituted by the dielectric, the second conductivity type buried layer, the dielectric trench and the first conductivity type implanted region realizes a full dielectric isolation between high voltage devices and low voltage devices integrated on one chip, so that a problem of crosstalk between high voltage devices and low voltage devices can be avoided. In another aspect, the six types of high voltage transistors are all designed with multiple channels which can effectively increase the current output capability of the high voltage transistors. Technically, this process is a bulk silicon process which has relatively low cost while can reach a reliability level comparable to the SOI process.

Figure 1:
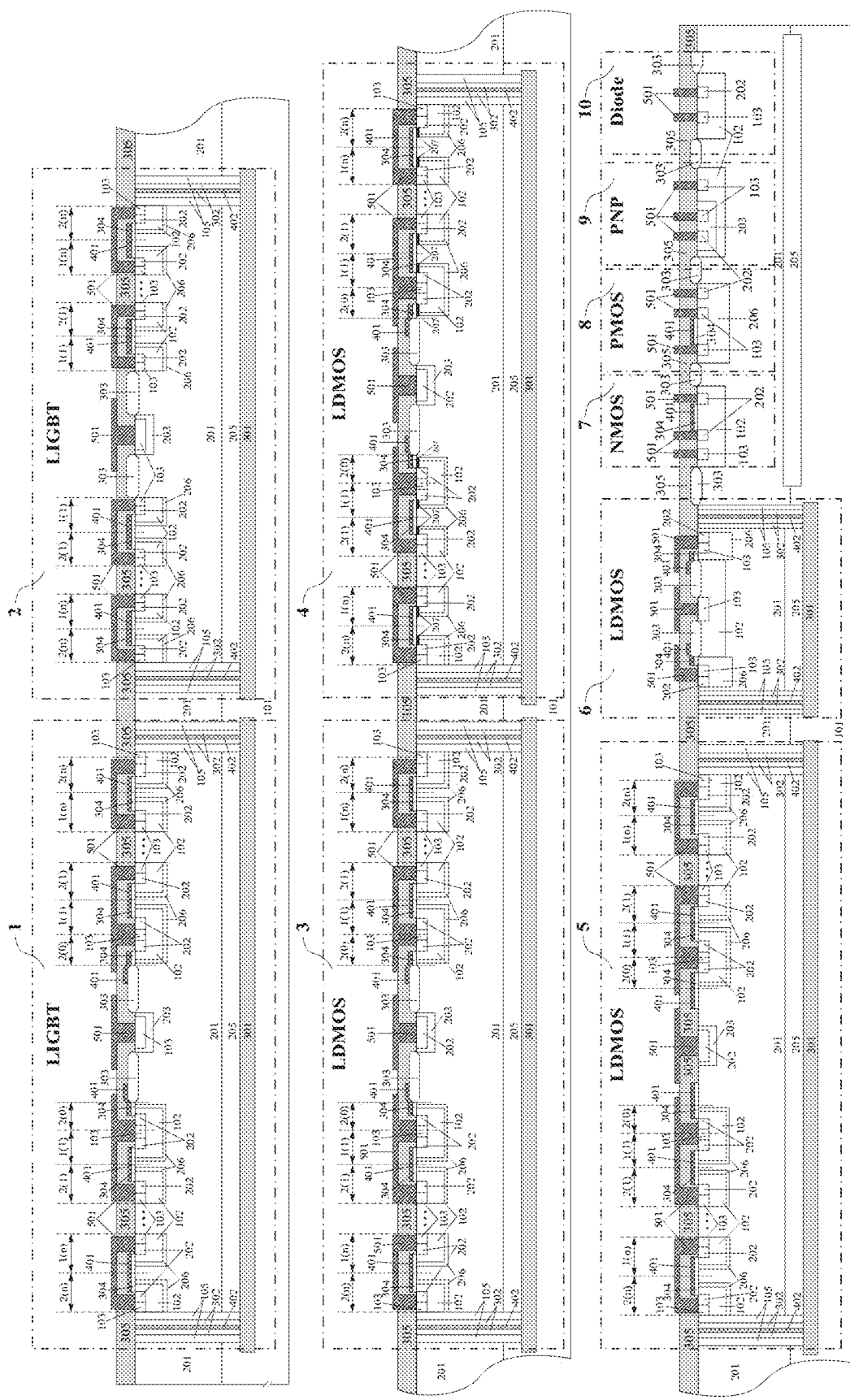
FIG. 1 is a structural schematic diagram of a BCD semiconductor device according to Embodiment 1 of the present invention.

In the drawings, 1 is a first high voltage nLIGBT device, 2 is a second high voltage nLIGBT device, 3 is a first high voltage nLDMOS device, 4 is a second high voltage nLDMOS device, 5 is a third high voltage nLDMOS device, 6 is a first high voltage pLDMOS device, 7 is a low voltage NMOS device, 8 is a low voltage PMOS device, 9 is a PNP device, 10 is a diode device, 11 is a third high voltage nLIGBT device, 12 is a fourth high voltage nLDMOS device, 13 is a fifth high voltage nLDMOS device, 14 is a sixth high voltage nLDMOS device, 15 is a second high voltage pLDMOS device, 16 is a second low voltage PMOS device, 17 is a second low voltage NMOS device, 18 is a NPN device, 19 is a second PNP device, and 20 is a second diode device.

101 is a substrate, 102 is a first conductivity type region, 103 is a first conductivity type contact region, 104 is a first conductivity type epitaxial layer, 105 is a first conductivity type implanted region, and 106 is a first conductivity type voltage withstanding structure; 201 is a second conductivity type epitaxial layer, 202 is a second conductivity type contact region, 203 is a second conductivity type buffer region, 205 is a second conductivity type buried layer, 206 is a second conductivity type well region, 207 is a second conductivity type implanted region, 208 is a second conductivity type dielectric electric field enhancement structure, 301 is a dielectric, 302 is a dielectric trench, 303 is a field oxide layer, 304 is a thin dielectric layer, 305 is a pre-metal dielectric layer, 401 is a gate terminal, 402 is a filler, and 501 is a metal layer.

2 (0) is a left cell, 2 (1) is a first left cell, 2 (2) is a second left cell . . . 2 (n) is a $n^{th}$ left cell; 1 (1) is a first right cell, 1 (2) is a second right cell . . . 1 (n) is a $n^{th}$ right cell.

DETAILED DESCRIPTION OF THE EMBODIMENTS

The implementations of the present invention are described hereinafter through specific embodiments. It is easy to understand other advantages and effects of the present invention by those skilled in the art according to the disclosure of the specification. The present invention may also be implemented or applied through other different specific embodiments, and various details in the specification may be modified or changed without departing from the spirit of the present invention based on different aspects and applications.

Embodiment 1

As shown in FIG. 1, a BCD semiconductor device, includes devices integrated on a single chip. The devices include a first high voltage nLIGBT device 1, a second high voltage nLIGBT device 2, a first high voltage nLDMOS device 3, a second high voltage nLDMOS device 4, a third high voltage nLDMOS device 5, a first high voltage pLDMOS device 6, a low voltage NMOS device 7, a low voltage PMOS device 8, a PNP device 9, and a diode device 10. A dielectric isolation is applied to the first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6 to achieve a complete isolation between high voltage devices and low voltage devices. A multi-channel design is applied to the first high voltage nLIGBT device 1, the second high voltage nLIGBT device 2, the first high voltage nLDMOS device 3, the second high voltage nLDMOS device 4, and the third high voltage nLDMOS device 5.

The first high voltage nLIGBT device 1 is located in an isolation region. The isolation region includes a dielectric 301, a second conductivity type buried layer 205, a dielectric trench 302, a filler 402, and a first conductivity type implanted region 105. The dielectric 301 is located in a substrate 101. The dielectric trench 302 is located in a second conductivity type epitaxial layer 201, extends to the substrate 101, and is connected to the dielectric 301 to form a complete isolation. The first conductivity type implanted region 105 is located on each side of the dielectric trench 302, and the filler 402 is located in the middle of the dielectric trench 302. The second conductivity type buried layer 205 is located above the dielectric 301. The first high voltage nLIGBT device 1 further includes a multi-channel emitter terminal located on each side of the device. The multi-channel emitter terminal includes a plurality of cells alternately arranged according to an order of a left cell 2 (0), a first right cell 1 (1), a first left cell 2 (1), a second right cell 1 (2), a second left cell 2 (2), . . . a $n^h$ right cell 1 (n), a $n^{th}$ left cell 2 (n) . . . . The first high voltage nLIGBT device 1 further includes a drift region consisting of the second conductivity type epitaxial layer 201, a collector terminal consisting of a first conductivity type contact region 103 formed by directly connecting a second conductivity type buffer region 203 and a metal layer 501, a field oxide layer 303 located on a surface of the second conductivity type epitaxial layer 201, the metal layer 501, and a pre-metal dielectric layer 305. Each cell of the emitter terminal includes a second conductivity type well region 206, a first conductivity type region 102 located in the second conductivity type well region 206, a first conductivity type contact region 103 directly connected to the metal layer 501 and located in the first conductivity type region 102, a second conductivity type contact region 202, and a thin dielectric layer 304 and a gate terminal 401 located on an upper surface of the first conductivity type region 102. The conductivity type of the surface of the first conductivity type region 102 is controlled through the gate terminal 401 and the thin dielectric layer 304 to turn on or turn off the devices.

A difference between the second high voltage nLIGBT device 2 and the first high voltage nLIGBT device 1 is that the multi-channel emitter terminal of the second high voltage nLIGBT device 2 includes a plurality of cells alternately arranged according to an order of a first right cell 1 (1), a first left cell 2 (1), a second right cell 1 (2), a second left cell 2 (2), . . . a $n^{th}$ right cell 1 (n), a $n^{th}$ left cell 2 (n) . . . .

The first high voltage nLDMOS device 3 is located in an isolation region. The isolation region includes a dielectric 301, a second conductivity type buried layer 205, a dielectric trench 302, a filler 402, and a first conductivity type implanted region 105. The dielectric 301 is located in a substrate 101. A dielectric trench 302 is located in a second conductivity type epitaxial layer 201, extends to the substrate 101, and is connected to the dielectric 301 to form a complete isolation. A first conductivity type implanted region 105 is located on each side of the dielectric trench 302. The filler 402 is located in the middle of the dielectric trench 302. A second conductivity type buried layer 205 is located above the dielectric 301. The first high voltage nLDMOS device 3 further includes a multi-channel source terminal located on both sides of the device. The multi-channel source terminal includes a plurality of cells alternately arranged according to an order of a left cell 2 (0), a first right cell 1 (1), a first left cell 2 (1), a second right cell 1 (2), a second left cell 2 (2), . . . a $n^{th}$ right cell 1 (n), a $n^{th}$ left cell 2 (n) . . . . The first high voltage nLDMOS device 3 further includes a drift region consisting of the second conductivity type epitaxial layer 201, a drain terminal consisting of a second conductivity type contact region 202 formed by directly connecting a second conductivity type buffer region 203 and a metal layer 501, a field oxide layer 303 located on a surface of the second conductivity type epitaxial layer 201, the metal layer 501 and a pre-metal dielectric layer 305. Each cell of the source terminal includes a second conductivity type well region 206, a first conductivity type region 102 located in the second conductivity type well region 206, a first conductivity type contact region 103 directly connected to the metal layer 501 and located in the first conductivity type region 102, a second conductivity type contact region 202, and a thin dielectric layer 304 and a gate terminal 401 located on an upper surface of the first conductivity type region 102. The conductivity type of the surface of the first conductivity type region 102 is controlled through the gate terminal 401 and the thin dielectric layer 304 to turn on or turn off the devices.

The second high voltage nLDMOS device 4 is different from the first high voltage nLDMOS device 3 in that a second conductivity type implanted region 207 is arranged between the thin dielectric layer 304 and an upper surface of the second conductivity type well region 206.

The third high voltage nLDMOS device 5 is different from the first high voltage nLDMOS device 3 in that no field oxide layer 303 is arranged on a surface of the second the conductivity type epitaxial layer 201.

The first high voltage pLDMOS device 6 is located at an isolation region. The isolation region includes a dielectric 301, a second conductivity type buried layer 205, a dielectric trench 302, a filler 402, and a first conductivity type implanted region 105. The dielectric 301 is located in a substrate 101. A dielectric trench 302 is located in a second conductivity type epitaxial layer 201, extends to the substrate 101, and is connected to the dielectric 301 to form a complete isolation. A first conductivity type implanted region 105 is located on each side of the dielectric trench 302. The filler 402 is located in the middle of the dielectric trench 302. A second conductivity type buried layer 205 is located above the dielectric 301. The first high voltage pLDMOS device 6 further includes: a source terminal formed by left cells 2 (0) located on both sides of the device, a drift region consisting of a first conductivity type region 102 located in a second conductivity type epitaxial layer 201, a drain terminal consisting of a first conductivity type contact region 103 located in a first conductivity type region 102, a field oxide layer 303 located above the second conductivity type epitaxial layer 201, a metal layer 501, and a pre-metal dielectric layer 305. The left cell 2 (0) constituting the source terminal includes a second conductivity type well region 206, another first conductivity type contact region 103 and a second conductivity type contact region 202 located in the second conductivity type well region 206 and directly connected to the metal layer 501, and a thin dielectric layer 304 and a gate terminal 401 located on an upper surface of the second conductivity type well region 206. The conductivity type of the surface of the second conductivity type well region 206 is controlled through the gate terminal 401 and the thin dielectric layer 304 to turn on or turn off the devices.

The low voltage NMOS device 7 is arranged in a first conductivity type region 102. The first conductivity type region 102 is located in a second conductivity type epitaxial layer 201. A second conductivity type contact region 202 and one of a first conductivity type contact region 103 serve as a source terminal and are located at a side of the first conductivity type region 102 and respectively connected to a metal layer 501. Another first conductivity type contact region 103 serves as a drain terminal and is located at the other side of the first conductivity type region 102 and connected to the metal layer 501. A gate terminal 401 is located above the thin dielectric layer 304 and below the pre-metal dielectric layer 305. The gate terminal 401 and the metal layer 501 are isolated from each other through the per-metal dielectric layer 305.

The low voltage PMOS device 8 is arranged in a second conductivity type well region 206. The second conductivity type well region 206 is located in a second conductivity type epitaxial layer 201. A second conductivity type contact region 202 and one of a first conductivity type contact region 103 serve as a source terminal and are located at a side of a first conductivity type region 102 and connected to a metal layer 501. Another first conductivity type contact region 103 serves as a drain terminal is located at the other side of the first conductivity type region 102 and connected to the metal layer 501. A gate terminal 401 is located above a thin dielectric layer 304 and below a pre-metal dielectric layer 305. The metal layer 501 is isolated with the gate terminal 401 through the pre-metal dielectric layer 305.

The PNP device 9 is arranged in a first conductivity type region 102 and below a pre-metal dielectric layer 305. A collector terminal of a first conductivity type contact region 103 is located in the first conductivity type region 102. An emitter terminal of the first conductivity type contact region 103 and a base terminal of a second conductivity type contact region 202 are located in a base region of a second conductivity type buffer region 203. The second conductivity type buffer region 203 is located in the first conductivity type region 102. The collector terminal of the first conductivity type contact region 103, the emitter terminal of the first conductivity type contact region 103, and the base terminal of the second conductivity type contact region 202 are all connected to a metal layer 501.

The diode device 10 is arranged in a first conductivity type region 102 and below a pre-metal dielectric layer 305. An anode of a first conductivity type contact region 103 is located in the first conductivity type region 102. A cathode of a second conductivity type contact region 202 is located in the first conductivity type region 102. The anode of the first conductivity type contact region 103 and the cathode of the second conductivity type contact region 202 are connected to a metal layer 501.

According to the BCD semiconductor device, in one aspect, the isolation region constituted by the dielectric 301, the second conductivity type buried layer 205, the dielectric trench 302, and the first conductivity type implanted region 105 realizes a full dielectric isolation between high voltage devices and low voltage devices integrated on one chip, so that a problem of crosstalk between high voltage devices and low voltage devices can be avoided. In another aspect, the six types of high voltage transistors are all designed with multiple channels which can effectively increase the current output capability of the high voltage transistors. Technically, this process is a bulk silicon process which has relatively low cost while can reach a reliability level comparable to the SOI process.

For the structure of the emitter terminal of the first high voltage nLIGBT device 1 and the structure of the source terminals of the first high voltage nLDMOS device 3, the second high voltage nLDMOS device 4, the third high voltage nLDMOS device 5, the first high voltage pLDMOS device 6, when the device ends with the n$^{th}$ left cell 2 (*n*) at the edge, the number of the channels is 2n+1; when n=0, the device is a single-channel device, when the device ends with the n$^{th}$ right cell 1 (*n*) at the edge, the number of the channels is 2n and n≥1. For the structure of the emitter terminal of the second high voltage nLIGBT device 2, when the device ends with the n$^{th}$ left cell 2 (*n*) at the edge, the number of the channels is 2n and n≥1, when the device ends with the n$^{th}$ right cell 1 (*n*) at the edge, the number of the channels is 2n+1, and when n=0, the device is a single-channel device.

Preferably, the structures of emitter terminals of the first high voltage nLIGBT device 1 and the second high voltage nLIGBT device 2 and the structures of source terminals of the third high voltage nLDMOS device 5 and the first high voltage pLDMOS device 6 further include a second conductivity type implanted region 207 located between the thin dielectric layer 304 and an upper surface of the second conductivity type well region 206. In this case, the above-mentioned high voltage devices pertain to depletion type devices.

Preferably, there is no left cell 2 (0) in the structure of the emitter terminal of the first high voltage nLIGBT device 1 and the structures of the source terminals of the first high voltage nLDMOS device 3, the second high voltage nLDMOS device 4, the third high voltage nLDMOS device 5, and the first high voltage pLDMOS device 6.

Preferably, there is no carrier storage layer 206 in the first high voltage nLIGBT device 1, the second high voltage nLIGBT device 2, the first high voltage nLDMOS device 3, the second high voltage nLDMOS device 4, and the third high voltage nLDMOS device 5.

Preferably, the first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6 have no first conductivity type implanted region 105 on two sides of the dielectric trench 302 and no second conductivity type buried layer 205 above the dielectric 301.

Preferably, in the first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6, the filler 402 in the dielectric trench 302 is polysilicon, silicon dioxide, or air.

Figure 8:
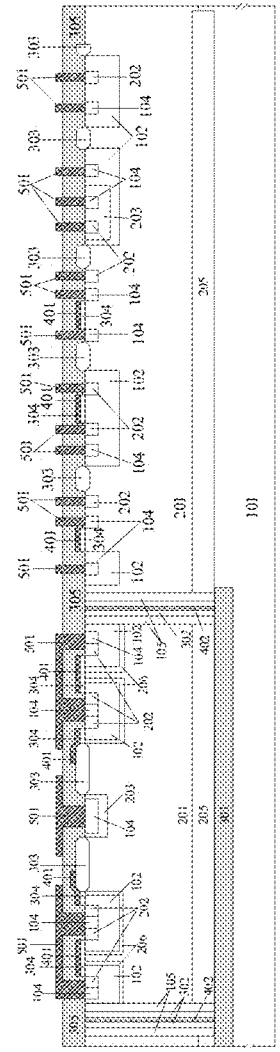
FIG. 8 is a simplified structural schematic diagram of a BCD semiconductor device according to Embodiment 1 of the present invention.
Figure 9A:
FIGS. 9(a)-9(m) show process flow diagrams of a BCD device of Embodiment 1 of the present invention.
Figure 9B:
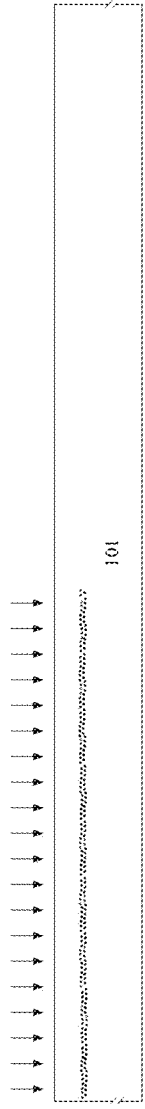
Figure 9C:
Figure 9D:
Figure 9E:
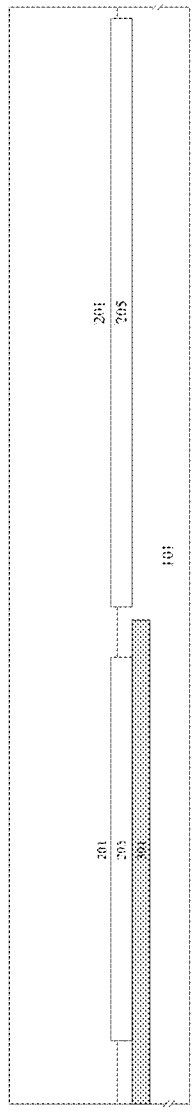
Figure 9:
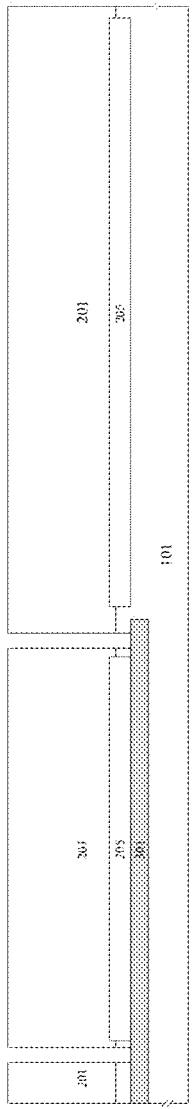
Figure 9:
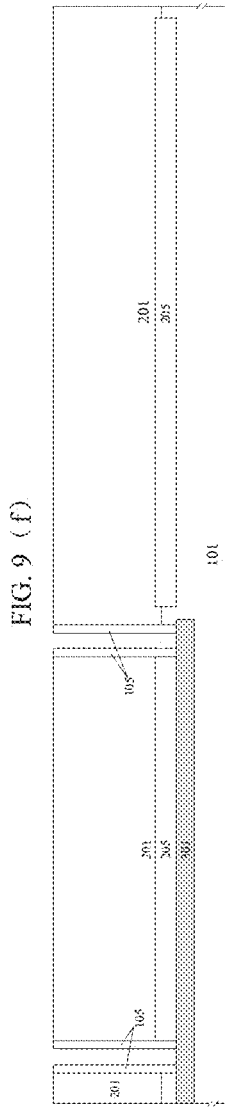
Figure 9:
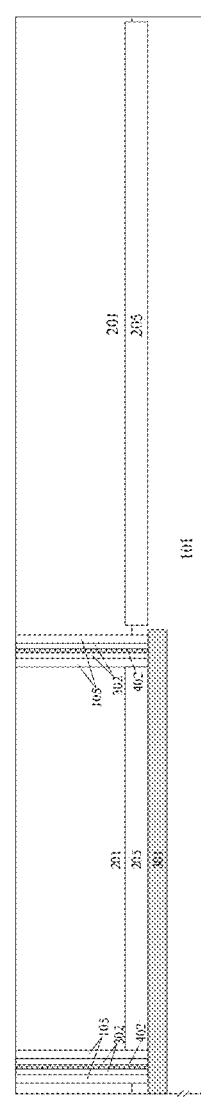
Figure 9:
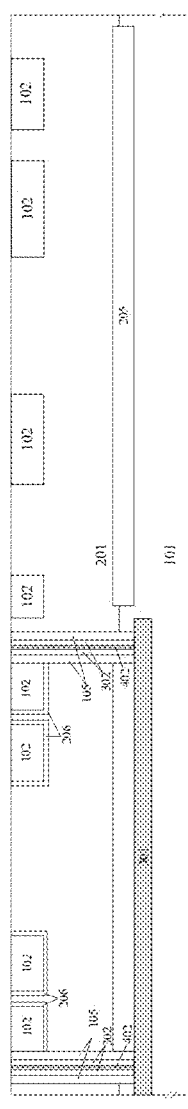
Figure 9:
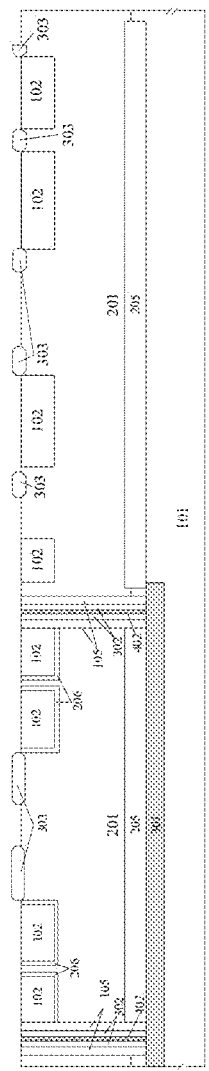
Figure 9:
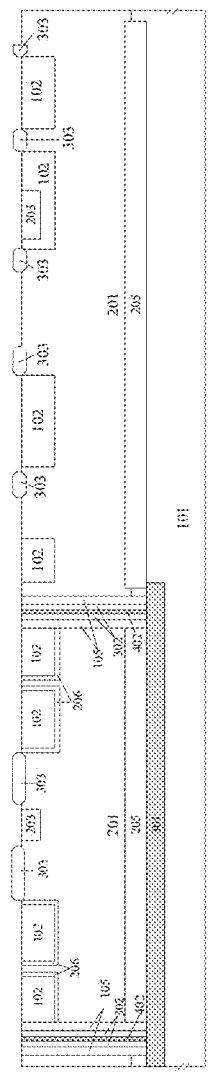
Figure 9:
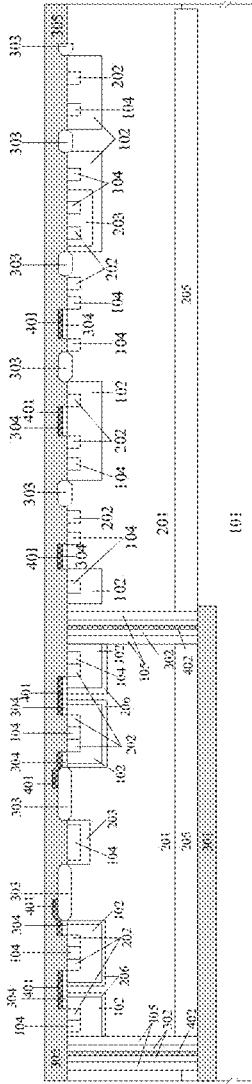
Figure 10:
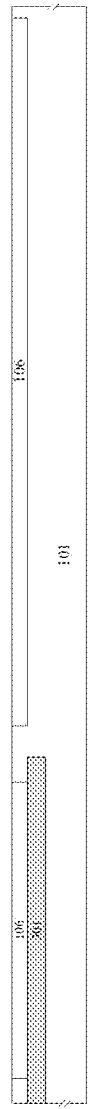
FIGS. 10(a)-10(m) show process flow diagrams of a BCD device according to Embodiment 8 of the present invention.
Figure 10:
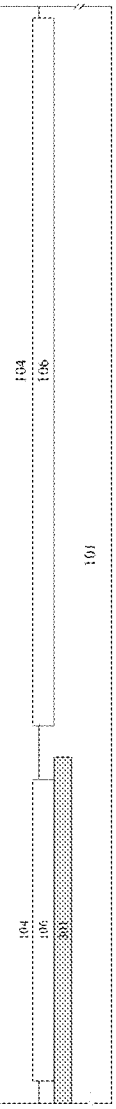
Figure 10:
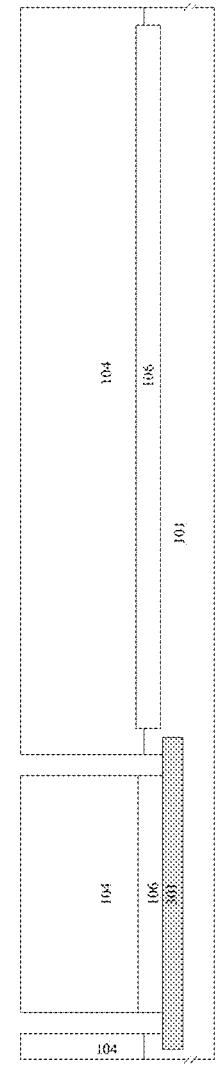
Figure 10:
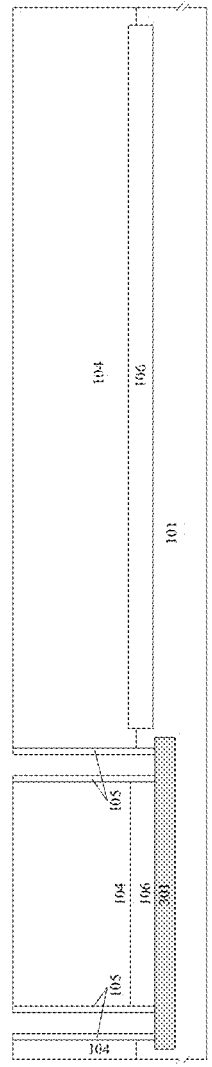
Figure 10:
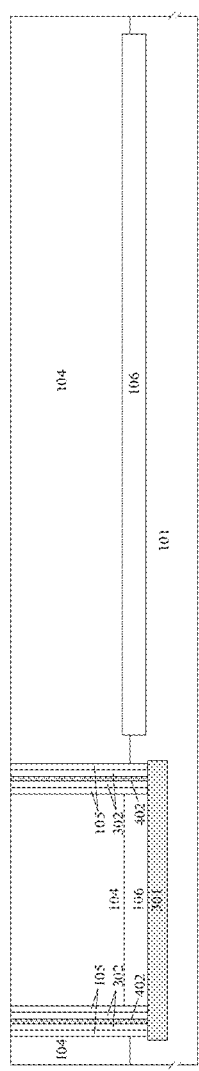
Figure 10:
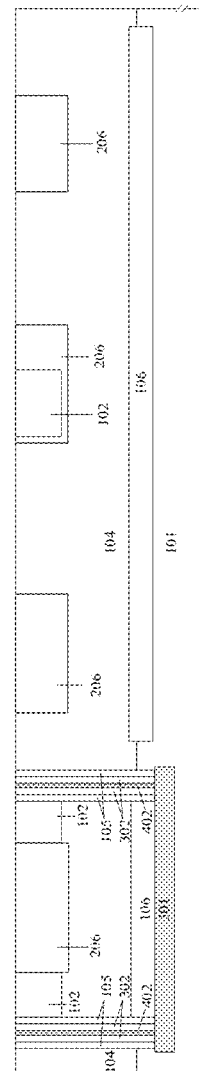
Figure 10:
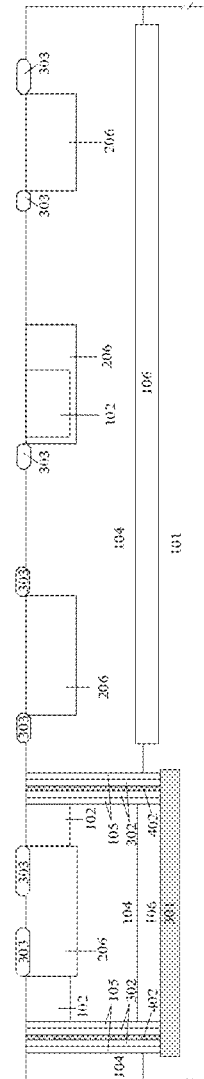
Figure 10:
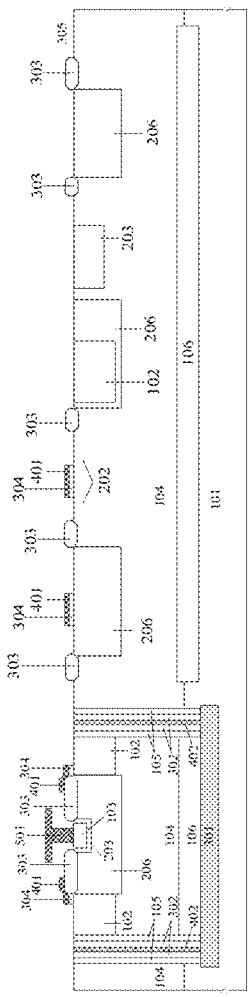
Figure 10:
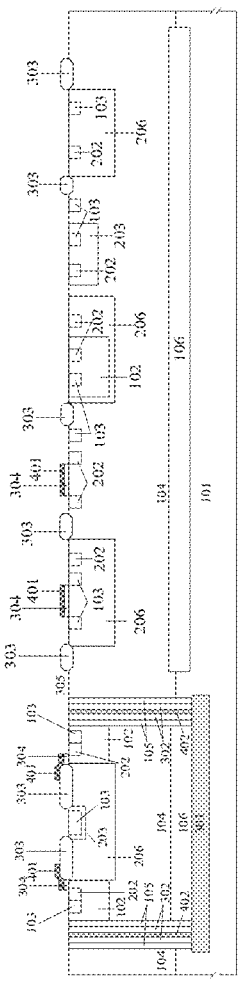
Figure 10:
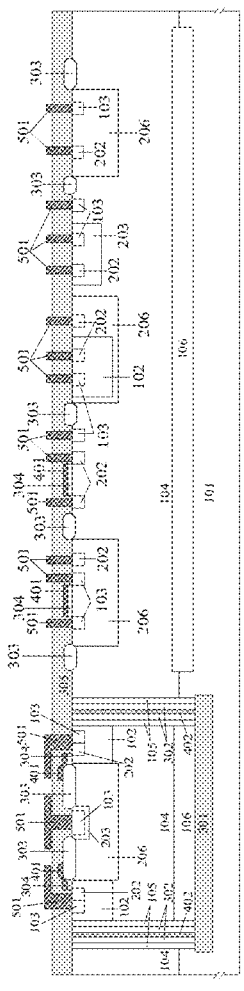

As shown in FIG. 8, a method for manufacturing the above-mentioned BCD semiconductor device includes the following steps.

Step 1, oxygen ions with a predetermined amount is implanted into a substrate 101 through a photolithography technique and an ion implantation technique, then an annealing treatment is performed to form a dielectric 301.

Step 2, second conductivity type impurities are implanted into the substrate 101 through the photolithography technique and the ion implantation technique.

Step 3, an epitaxy is performed to form a second conductivity type epitaxial layer 201. Meanwhile, a second conductivity type buried layer 205 above the dielectric 301 is formed in a high temperature process of the epitaxy.

Step 4, a deep trench is etched after a shield layer is etched on an upper electrode of the second conductivity type epitaxial layer 201 through the photolithography technique and an etching technique, and a first conductivity type implanted region 105 is formed on a side wall of the deep trench in a manner of inclined angle implantation.

Step 5, an oxide layer is thermally grown on the side wall of the trench and an upper surface of the second conductivity type epitaxial layer 201, a dielectric trench 302 is formed, a polysilicon is deposited to fill the remaining gaps in the deep trench, and the polysilicon and on the upper surface of second conductivity type epitaxial layer 201 is removed, an active region is formed after the photolithography technique and the etching technique.

Step 6, first conductivity type impurities and second conductivity type impurities are respectively implanted into the second conductivity type epitaxial layer 201 by different energies through the photolithography technique and the ion implantation technique, then the annealing treatment is performed to form a first conductivity type region 102 and a second conductivity type well region 206.

Step 7, the active region is formed by photolithographing, and a field oxide layer 303 is thermally grown on the upper surface of the second conductivity type epitaxial layer 201.

Step 8, the second conductivity type impurities are implanted into the second conductivity type epitaxial layer 201 through the photolithography technique and the ion implantation technique, then an annealing treatment is performed to form a second conductivity type buffer region 203.

Step 9, a thin dielectric layer 304 is formed through a thermal oxidation growth, the polysilicon is deposited, the photolithography and the ion implantation are performed, so that a first conductivity type contact region 103 and a second conductivity type contact region 202 are formed.

Step 10, a pre-metal dielectric layer 305 is deposited, and a metal layer 501 is deposited after punching.

Preferably, an annealing process is added between step 3 and step 4 to ensure a formation of the second conductivity type buried layer 205. In step 6, the trench is filled through a method of deposition first, and the growth of the field oxide layer is performed subsequently.

Embodiment 2

Figure 2:
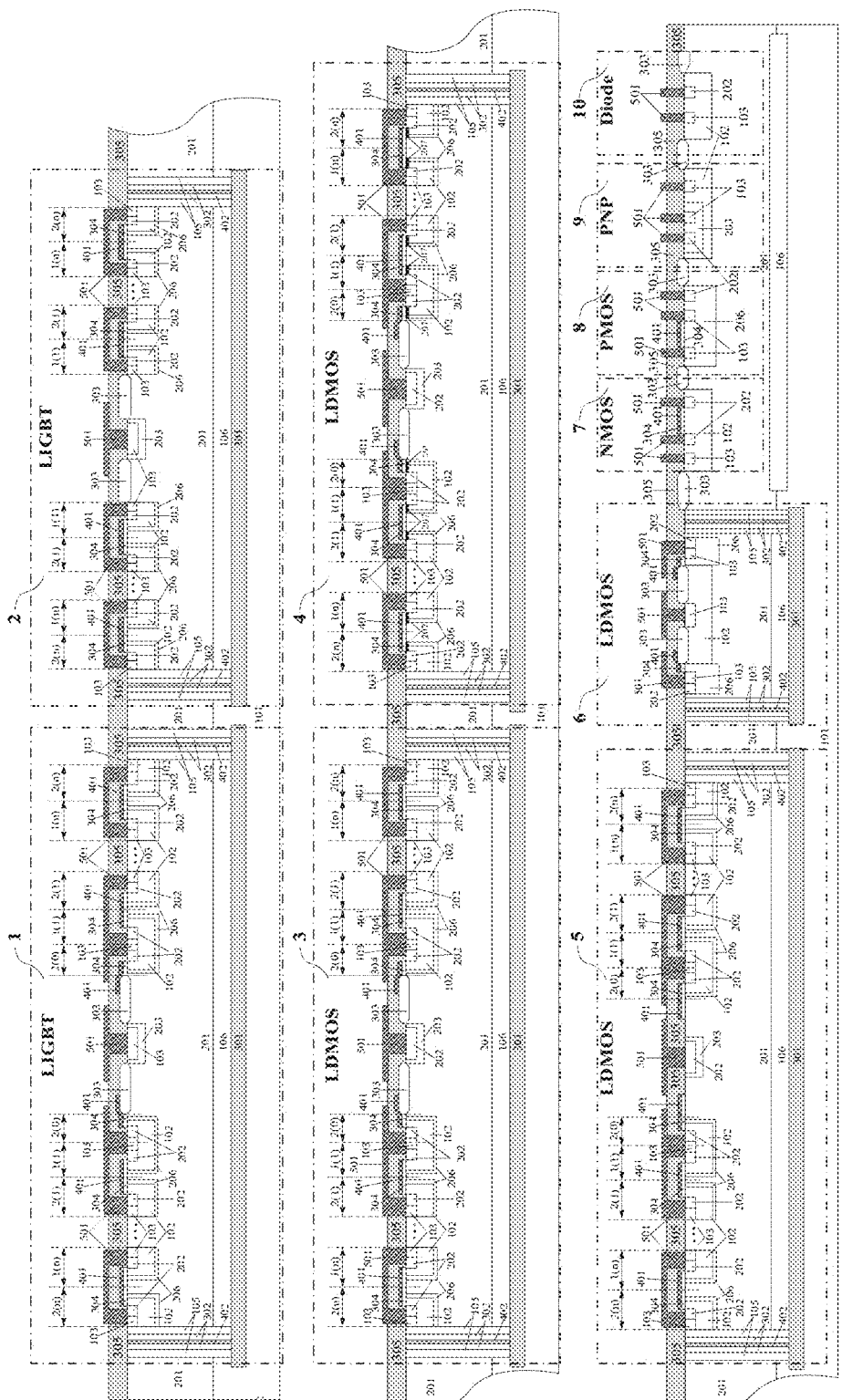
FIG. 2 is a structural schematic diagram of a BCD semiconductor device according to Embodiment 2 of the present invention.

As shown in FIG. 2, the difference between the BCD semiconductor device of this embodiment and the BCD semiconductor device of Embodiment 1 is that the second conductivity type buried layers 205 above the dielectrics 301 of the first high voltage nLIGBT device 1, the second high voltage nLIGBT device 2, the first high voltage nLDMOS device 3, the second high voltage nLDMOS device 4, the third high voltage nLDMOS device 5, the first high voltage pLDMOS device 6 are replaced with a first conductivity type voltage withstanding structure 106. The first conductivity type voltage withstanding structures 106 are connected to the first conductivity type implanted region 105 on the side wall of the dielectric trench 302.

Embodiment 3

Figure 3:
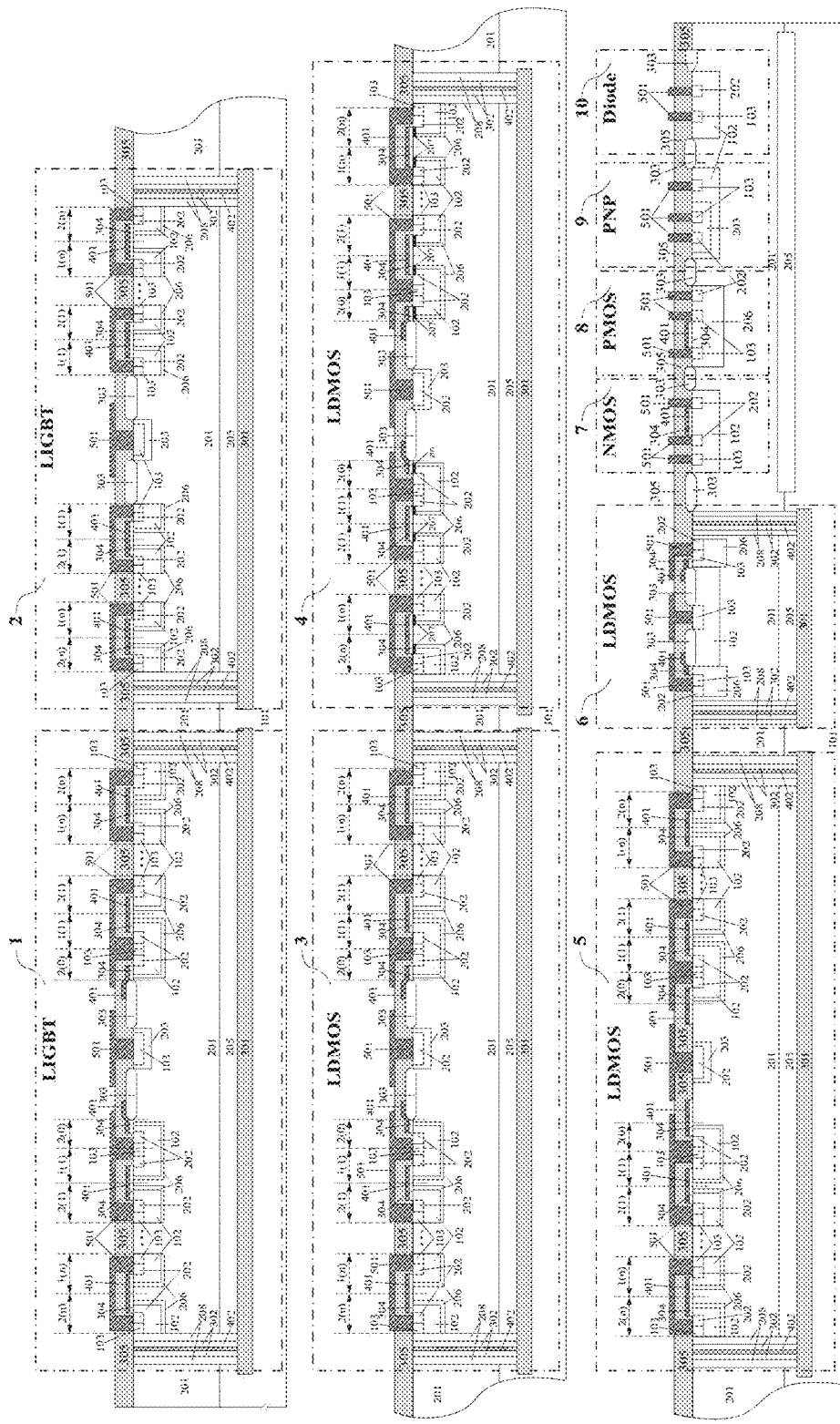
FIG. 3 is a structural schematic diagram of a BCD semiconductor device according to Embodiment 3 of the present invention.

As shown in FIG. 3, the difference between the BCD semiconductor device of this embodiment and the BCD semiconductor device of Embodiment 1 is that the first conductivity type implanted regions 105 on the left and right of the side walls of dielectric trenches 302 of the first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6 are replaced with a second conductivity type dielectric electric field enhancement structure 208.

Embodiment 4

The difference between the BCD semiconductor device of this embodiment and the BCD semiconductor device of Embodiment 1 is that first conductivity type implanted regions 105 on the left and right of the side walls of dielectric trenches 302 of first high voltage nLIGBT device 1, second high voltage nLIGBT device 2, first high voltage nLDMOS device 3, second high voltage nLDMOS device 4, third high voltage nLDMOS device 5, first high voltage pLDMOS device 6 are replaced with a second conductivity type dielectric electric field enhancement structure 208. Meanwhile, the second conductivity type buried layers 205 above dielectrics 301 are replaced with a first conductivity type voltage withstanding structure 106.

Embodiment 5

Figure 4:
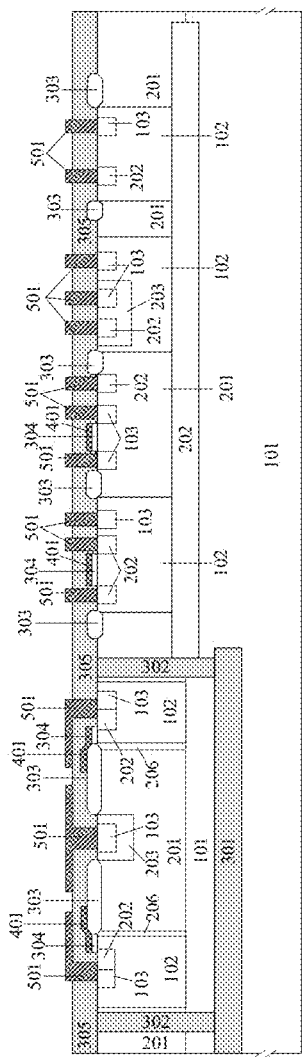
FIG. 4 is a structural schematic diagram of a BCD semiconductor device according to Embodiment 5 of the present invention.

As shown in FIG. 4, the difference between the BCD semiconductor device of this embodiment and the BCD semiconductor device of Embodiment 1 is that the first conductivity type regions 102 and second conductivity type well regions 206 of the first high voltage nLIGBT device 1, the second high voltage nLIGBT device 2, the first high voltage nLDMOS device 3, the second high voltage nLDMOS device 4, the third high voltage nLDMOS device 5, and the first high voltage pLDMOS device 6 touch the substrate 101 or dielectric 301. In this case, these devices are single-channel devices.

Embodiment 6

Figure 5:
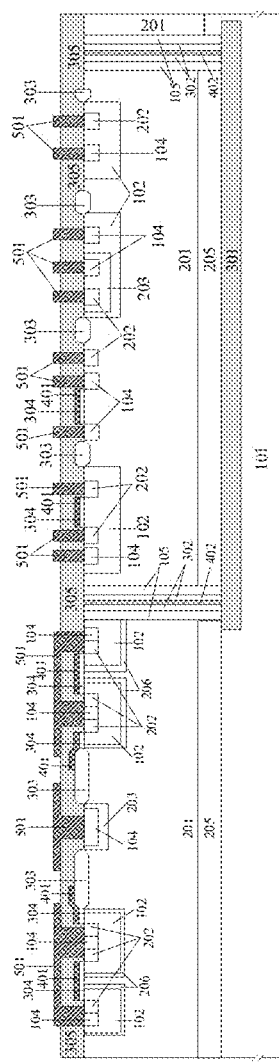
FIG. 5 is a structural schematic diagram of a BCD semiconductor device according to Embodiment 6 of the present invention.

As shown in FIG. 5, the difference between the BCD semiconductor device of this embodiment and the BCD semiconductor device of Embodiment 1 is that the high voltage devices are arranged inside a dielectric island, or the low voltage devices are arranged inside an isolation island according to a dielectric isolation.

Embodiment 7

Figure 6:
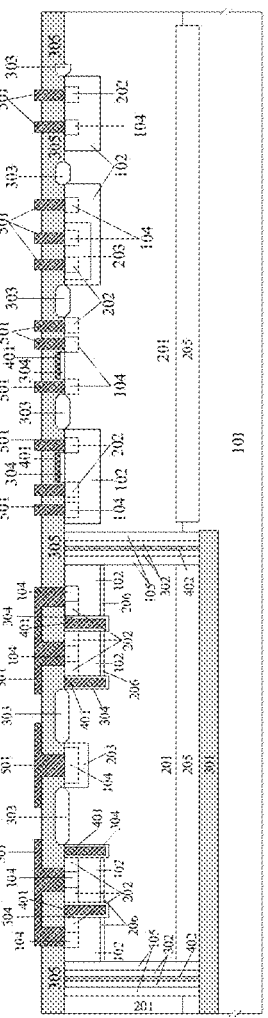
FIG. 6 is a structural schematic diagram of a BCD semiconductor device according to Embodiment 7 of the present invention.

As shown in FIG. 6, the difference of the BCD semiconductor device of this embodiment and the BCD semiconductor device of Embodiment 1 is that gate terminal 401 has a trench gate structure.

Embodiment 8

Figure 7:
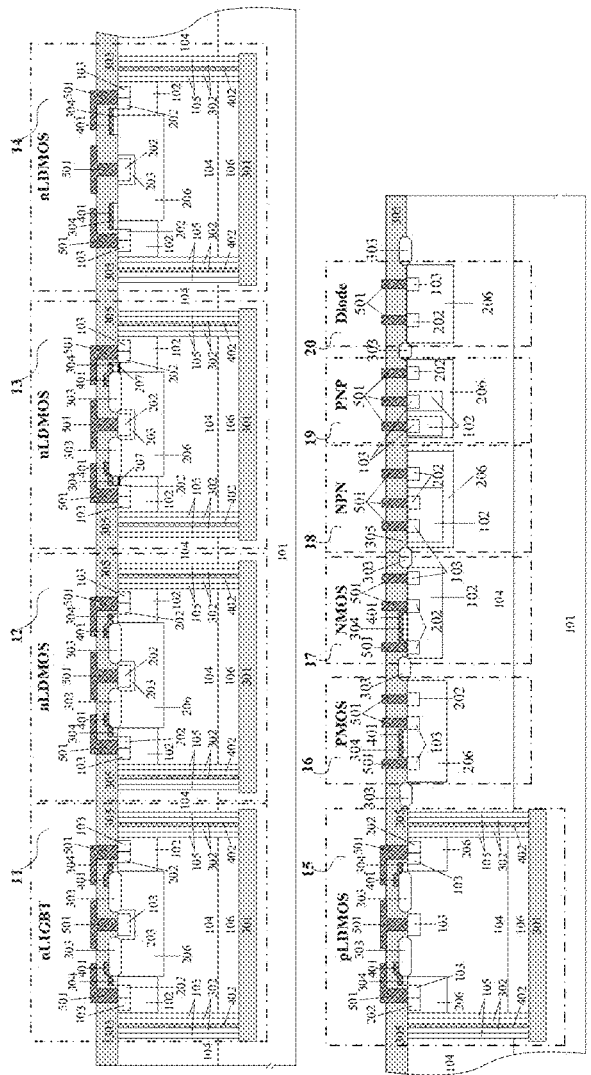
FIG. 7 is a structural schematic diagram of a BCD semiconductor device according to Embodiment 8 of the present invention.

As shown in FIG. 7, a BCD semiconductor device includes devices integrated on a single chip. The devices include a third high voltage nLIGBT device 11, a fourth high voltage nLDMOS device 12, a fifth high voltage nLDMOS device 13, a sixth high voltage nLDMOS device 14, a second high voltage pLDMOS device 15, a second low voltage PMOS device 16, a second low voltage NMOS device 17, a NPN device 18, a second PNP device 19, and a second diode device 20. A dielectric isolation is applied to the third high voltage nLIGBT device 11, the fourth high voltage nLDMOS device 12, the fifth high voltage nLDMOS device 13, the sixth high voltage nLDMOS device 14, and the second high voltage pLDMOS device 15 to realize a complete isolation between the high voltage devices and the low voltage devices.

The third high voltage nLIGBT device 11 is located in an isolation region. The isolation region includes a dielectric 301, a first conductivity type voltage withstanding structure 106, a dielectric trench 302, a filler 402, and a first conductivity type implanted region 105. The dielectric 301 is located in a substrate 101. The dielectric trench 302 is located in a first conductivity type epitaxial layer 104, extends to the substrate 101, and is connected to the dielectric 301 to form a complete isolation. The first conductivity type implanted region 105 is located on each side of the dielectric trench 302. The filler 402 is located in the middle of the dielectric trench 302. The first conductivity type voltage withstanding structure 106 is located above the dielectric 301. The third high voltage nLIGBT device 11 further includes: a second conductivity type well region 206 located in a first conductivity type epitaxial layer 104, wherein the second conductivity type well region 206 serves as a drift region; a second conductivity type buffer region 203 located in the second conductivity type well region 206, wherein the second conductivity type buffer region 203 serves as a field stop region; a first conductivity type contact region 103 located in a second conductivity type buffer region 203 and connected to a metal layer 501, wherein the first conductivity type contact region 103 serves as a collector terminal; a field oxide layer 303 located above the second conductivity type well region 206; a gate terminal 401 and a thin dielectric layer 304 located on a side of the field oxide layer 303 near an emitter terminal, and on an upper surface of the first conductivity type region 102; another first conductivity type contact region 103 and a second conductivity type contact region 202 located on a side of the gate terminal 401 far away from the field oxide layer 303 and connected to the metal layer 501. The metal layer 501 is isolated with the gate terminal 401 through a pre-metal dielectric layer 305.

The fourth high voltage nLDMOS device 12 is located in an isolation region. The isolation region includes a dielectric 301, a first conductivity type voltage withstanding structure 106, a dielectric trench 302, a filler 402, and a first conductivity type implanted region 105. The dielectric 301 is located in a substrate 101. A dielectric trench 302 is located in a first conductivity type epitaxial layer 104, extends to the substrate 101, and is connected to the dielectric 301 to form a complete isolation. A first conductivity type implanted region 105 is located on each side of the dielectric trench 302. The filler 402 is located in the middle of the dielectric trench 302. The first conductivity type voltage withstanding structure 106 is located above the dielectric 301. The fourth high voltage nLDMOS device 12 further includes: a second conductivity type well region 206 located in a first conductivity type epitaxial layer 104, wherein the second conductivity type well region 206 serves as a drift region; a second conductivity type buffer region 203 located in a second conductivity type well region 206, wherein the second conductivity type buffer region 203 serves as a field stop region; a second conductivity type contact region 202 located in a second conductivity type buffer region 203 and connected to a metal layer 501, wherein the second conductivity type contact region 202 serves as a drain terminal; a field oxide layer 303 located above the second conductivity type well region 206; a gate terminal 401 and a thin dielectric layer 304 located on a side of the field oxide layer 303 near a source terminal and on an upper surface of a first conductivity type region 102; a first conductivity type contact region 103 and another second conductivity type contact region 202 located on a side of the gate terminal 401 far away from the field oxide layer 303 and connected to the metal layer 501. The metal layer 501 is isolated with the gate terminal 401 through a pre-metal dielectric layer 305.

The fifth high voltage nLDMOS device 13 is different from the fourth high voltage nLDMOS device 12 in that the second conductivity type implanted region 207 is located on an upper surface of the first conductivity type region 102, and the gate terminal 401 and the thin dielectric layer 304 are located on an upper surface of the second conductivity type implanted region 207.

The sixth high voltage nLDMOS device 14 is different from the fourth high voltage nLDMOS device 12 in that no field oxide layer 303 is arranged above the second conductivity type well region 206.

The second high voltage pLDMOS device 15 is located in an isolation region. The isolation region includes a dielectric 301, a second conductivity type buried layer 205, a dielectric trench 302, a filler 402, and a first conductivity type implanted region 105. The dielectric 301 is located in a substrate 101. A dielectric trench 302 is located in a first conductivity type epitaxial layer 104, extends to the substrate 101 and is connected to the dielectric 301 to form a complete isolation. The first conductivity type implanted region 105 is located on each side of the dielectric trench 302. The filler 402 is located in the middle of the dielectric trench 302. The second conductivity type buried layer 205 is located above the dielectric 301. The second high voltage pLDMOS device 15 further includes: a first conductivity type contact region 103 located in the first conductivity type epitaxial layer 104 and connected to a metal layer 501, wherein the first conductivity type contact region 103 serves as a drain terminal; a gate terminal 401 and a thin dielectric layer 304 located on an upper surface of a second conductivity type well region 206; a field oxide layer 303 located on an upper surface of the first conductivity type epitaxial layer 104 and between the second conductivity type well region 206 and the first conductivity type contact region 103; another first conductivity type contact region 103 and a second conductivity type contact region 202 located on a side of the gate terminal 401 far away from the field oxide layer 303 and respectively connected to the metal layer 501. The metal layer 501 is isolated with the gate terminal 401 through a pre-metal dielectric layer 305.

The second low voltage PMOS device 16 is arranged in a second conductivity type well region 206, and the second conductivity type well region 206 is located in a first conductivity type epitaxial layer 104. A second conductivity type contact region 202 and a first conductivity type contact region 103 are respectively connected to a metal layer 501 to serve as source terminals and are located on a side inside the second conductivity type well region 206. Another first conductivity type contact region 103 is connected to a metal layer 501 to serve as a drain terminal. Another gate terminal inside the second conductivity type well region 206 is located above a thin dielectric layer 304 and below a pre-metal dielectric layer 305. The gate terminal 401 and the metal layer 501 are isolated from the gate terminal 4011 through the pre-metal dielectric layer 305.

The second low voltage NMOS device 17 is arranged inside a first conductivity type region 102, and the first conductivity type region 102 is located in a first conductivity type epitaxial layer 104. A second conductivity type contact region 202 and a first conductivity type contact region 103 are respectively connected to a metal layer 501 to serve as source terminals and are located on a side inside the first conductivity type region 102. Another second conductivity type contact region 202 is connected to the metal layer 501 to serve as a drain terminal and is located on another side inside the first conductivity type region 102. The gate terminal 401 is located above a thin dielectric layer 304 and below a pre-metal dielectric layer 305. The gate terminal 401 is isolated with the metal layer 501 through the pre-metal dielectric layer 305.

The NPN device 18 is arranged in a second conductivity type well region 206 and below a pre-metal dielectric layer 305. A collector terminal of a second conductivity type contact region 202 is located in the second conductivity type well region 206. An emitter terminal of the second conductivity type contact region 202 and a base terminal of a first conductivity type contact region 103 are located in a base region of a first conductivity type region 102. The emitter terminal of the second conductivity type contact region 202, the collector terminal of the second conductivity type contact region 202, and the base terminal of the first conductivity type contact region 103 are all connected to a metal layer 501.

The second PNP device 19 is arranged in a first conductivity type epitaxial layer 104 and below a pre-metal dielectric layer 305. A collector terminal and an emitter terminal of a first conductivity type contact region 103 are located in a first conductivity type region 102, respectively. A base terminal of a second conductivity type contact region 202 is located in a base region of a second conductivity type well region 206. The first conductivity type region 102 is also located in the second conductivity type well region 206. The collector terminal of the first conductivity type contact region 103, the emitter terminal of the first conductivity type contact region 103, and the base terminal of the second conductivity type region 202 are all connected to a metal layer 501.

The second diode device 20 is arranged in a second conductivity type well region 206 and below a pre-metal dielectric layer 305. An anode of a first conductivity type contact region 103 is located in a second conductivity type well region 206 and a cathode of a second conductivity type contact region 202 is also located in the second conductivity type well region 206. The anode of the first conductivity type contact region 103 and the cathode of the second conductivity type contact region 202 are connected to a metal layer 501.

A method for manufacturing the BCD semiconductor device includes the following steps.

Step 1, oxygen ions with a predetermined amount is implanted into a substrate 101 and then an annealing treatment is performed to form a dielectric 301 through a photolithography technique and an ion implantation technique.

Step 2, first conductivity type impurities are implanted into the substrate 101 through the photolithography technique and the ion implantation technique.

Step 3, an epitaxy is performed to form a first conductivity type epitaxial layer 104. Meanwhile, a first conductivity type voltage withstanding structure 106 above the dielectric 301 is formed in a high temperature annealing process.

Step 4, a deep trench is etched after a shield layer is etched on an upper electrode of the first conductivity type epitaxial layer 104 through the photolithography technique and an etching technique, and a first conductivity type implanted region 105 is formed on a side wall of the deep trench in a manner of inclined angle implantation.

Step 5, an oxide layer is thermally grown on the side wall of the trench and an upper surface of the first conductivity type epitaxial layer 104, a dielectric trench 302 is formed, a polysilicon is deposited to fill the remaining gaps in the deep trench, and the polysilicon and oxide layer on an upper surface of a first conductivity type epitaxial layer 104 is removed through CMP.

Step 6, first conductivity type impurities and second conductivity type impurities are respectively implanted into the first conductivity type epitaxial layer 104 by different energies through the photolithography technique and the ion implantation technique, then the annealing treatment is performed to form a first conductivity type region 102 and a second conductivity type well region 206.

Step 7, an active region is formed by photolithographing, and an oxide layer is thermally grown on the upper surface of the first conductivity type epitaxial layer 104 to form a field oxide layer 303, and a photoresist is removed.

Step 8, the second conductivity type impurities are implanted into the first conductivity type epitaxial layer 104 through the photolithography technique and the ion implantation technique, then an annealing treatment is performed to form a second conductivity type buffer region 203, a thin dielectric layer 304 is formed through a thermal oxidation growth, a gate terminal 401 is formed by deposition, and a photoetching is performed.

Step 9, the photolithography and the ion implantation are performed to form a first conductivity type contact region 103 and a second conductivity type contact region 202.

Step 10, a pre-metal dielectric layer 305 is deposited, and a metal layer 501 is deposited after punching.

Preferably, an annealing process is added between step 3 and step 4 to ensure a formation of the first conductivity type voltage withstanding structure 106. In step 6, the trench is filled in the method of deposition first, and the growth of the field oxide layer is performed, subsequently.

The above-mentioned embodiments merely illustrate the principle and effects of the present invention, exemplarily rather than limit the present invention. Modifications and variations may be derived by those skilled in the art according to the above-mentioned embodiments without departing from the spirit and scope of the present invention. Therefore, any equivalent modification or variation made by those of common knowledge in the art without departing from the spirit and technical idea disclosed by the present invention should still be considered as falling within the scope of the appended claims of the present invention.

What is claimed is:

1. A BCD (Bipolar CMOS DMOS) semiconductor device comprising a plurality of devices integrated on a single chip,
    wherein the plurality of devices comprises a first high voltage nLIGBT device, a second high voltage nLIGBT device, a first high voltage nLDMOS device, a second high voltage nLDMOS device, a third high voltage nLDMOS device, a first high voltage pLDMOS device, a low voltage NMOS device, a low voltage PMOS device, a PNP device, and a diode device;
    wherein a dielectric isolation is applied to the first high voltage nLIGBT device, the second high voltage nLIGBT device, the first high voltage nLDMOS device, the second high voltage nLDMOS device, the third high voltage nLDMOS device, and the first high voltage pLDMOS device to achieve a complete isolation between high voltage devices and low voltage devices;
    wherein, a multi-channel design is applied to the first high voltage nLIGBT device, the second high voltage nLIGBT device, the first high voltage nLDMOS device, the second high voltage nLDMOS device, and the third high voltage nLDMOS device.

2. The BCD semiconductor device of claim 1, wherein the first high voltage nLIGBT device is located in a first isolation region, the first isolation region comprises a dielectric, a second conductivity type buried layer, a dielectric trench, a filler, and a first conductivity type implanted region; wherein the dielectric is located in a substrate, the dielectric trench is located in a second conductivity type epitaxial layer, the dielectric trench extends to the substrate and is connected to the dielectric to form a complete isolation, the first conductivity type implanted region is located on each side of the dielectric trench, the filler is located in a middle of the dielectric trench, the second conductivity type buried layer is located above the dielectric, and the first high voltage nLIGBT device further comprises a multi-channel emitter terminal located on each side of the first high voltage nLIGBT device; wherein, the multi-channel emitter terminal comprises a plurality of cells alternately arranged according to an order of a left cell 2 (0), a first right cell 1 (1), a first left cell 2 (1), a second right cell 1 (2), a second left cell 2 (2), . . . a $n^{th}$ right cell 1 (n), a $n^{th}$ left cell 2 (n) . . . ; wherein, the first high voltage nLIGBT device further comprises a drift region consisting of the second conductivity type epitaxial layer, a collector terminal consisting of a first conductivity type contact region formed by directly connecting a second conductivity type buffer region and a metal layer, the metal layer, a pre-metal dielectric layer, and a field oxide layer located on a surface of the second conductivity type epitaxial layer, each of the plurality of cells of the multi-channel emitter terminal comprises a second conductivity type well region, a first conductivity type region located in the second conductivity type well region, a first conductivity type contact region and a second conductivity type contact region directly connected to the metal layer and located in the first conductivity type region, a thin dielectric layer and a gate terminal located on an upper surface of the first conductivity type region; a difference between the second high voltage nLIGBT device and the first high voltage nLIGBT device is that the multi-channel emitter terminal of the second high voltage nLIGBT device comprises a plurality of cells alternately arranged according to an order of a first right cell 1 (1), a first left cell 2 (1), a second right cell 1 (2), a second left cell 2 (2), . . . a $n^{th}$ right cell 1 (n), a $n^{th}$ left cell 2 (n) . . . ;

the first high voltage nLDMOS device is located in a second isolation region, wherein the second isolation region comprises a dielectric, a second conductivity type buried layer, a dielectric trench, a filler, and a first conductivity type implanted region; wherein the dielectric is located in the substrate, a dielectric trench is located in the second conductivity type epitaxial layer, the dielectric trench extends to the substrate and is connected to the dielectric to form a complete isolation, the first conductivity type implanted region is located on each side of the dielectric trench, the filler is located in a middle of the dielectric trench, a second conductivity type buried layer is located above the dielectric; the first high voltage nLDMOS device further comprises a multi-channel source terminal located on both sides of the first high voltage nLDMOS device, wherein the multi-channel source terminal comprises a plurality of cells alternately arranged according to an order of a left cell 2 (0), a first right cell 1 (1), a first left cell 2 (1), a second right cell 1 (2), a second left cell 2 (2), . . . a $n^{th}$ right cell 1 (n), a $n^{th}$ left cell 2 (n) . . . ; the first high voltage nLDMOS device further comprises a drift region consisting of the second conductivity type epitaxial layer, a drain terminal consisting of a second conductivity type contact region formed by directly connecting a second conductivity type buffer region and a metal layer, the metal layer, a pre-metal dielectric layer, and a field oxide layer located on a surface of the second conductivity type epitaxial layer, each of the plurality of cells of the multi-channel source terminal comprises a second conductivity type well region, a first conductivity type region located in the second conductivity type well region, a second conductivity type contact region and a first conductivity type contact region directly connected to the metal layer and located in the first conductivity type region, and a thin dielectric layer and a gate terminal located on an upper surface of the first conductivity type region; wherein the second high voltage nLDMOS device is different from the first high voltage nLDMOS device in that a second conductivity type implanted region is arranged between the thin dielectric layer and an upper surface of the second conductivity type well region; the third high voltage nLDMOS device is different from the first high voltage nLDMOS device in that no field oxide layer is arranged on a surface of the second conductivity type epitaxial layer;

the first high voltage pLDMOS device is located at a third isolation region, wherein the third isolation region comprises a dielectric, a second conductivity type buried layer, a dielectric trench, a filler, and a first conductivity type implanted region; wherein the dielectric is located in the substrate, a dielectric trench is located in the second conductivity type epitaxial layer, the dielectric trench extends to the substrate and is connected to the dielectric to form a complete isolation, the first conductivity type implanted region is located on each side of the dielectric trench, a filler is located in a middle of the dielectric trench, and a second conductivity type buried layer is located above the dielectric; wherein the first high voltage pLDMOS device further comprises a source terminal formed by left cells 2 (0) located on both sides of the first high voltage pLDMOS device, a drift region consisting of a first conductivity type region located in the second conductivity type epitaxial layer, a drain terminal consisting of a first conductivity type contact region located in a first conductivity type region, a metal layer, a field oxide layer and a pre-metal dielectric layer located above the second conductivity type epitaxial layer, wherein the left cell 2 (0) constituting the source terminal comprises a second conductivity type well region, a first conductivity type contact region and a second conductivity type contact region located in the second conductivity type well region and directly connected to the metal layer, and a thin dielectric layer and a gate terminal located on an upper surface of the second conductivity type well region;

the low voltage NMOS device is arranged in a first conductivity type region, the first conductivity type region is located in the second conductivity type epitaxial layer, a second conductivity type contact region and a first first conductivity type contact region serve as a source terminal and are located at a first side of the first conductivity type region and respectively connected to a metal layer, a second first conductivity type contact region serves as a drain terminal and is located at a second side of the first conductivity type region and connected to the metal layer, a gate terminal is located above a thin dielectric layer and below a pre-metal dielectric layer, the gate terminal and the metal layer are isolated from each other through the dielectric layer in front of the metal layer;

the low voltage PMOS device is arranged in a second conductivity type well region, the second conductivity type well region is located in the second conductivity type epitaxial layer, a second conductivity type contact region and a first first conductivity type contact region serve as a source terminal and are located at a first side of a first conductivity type region and connected to a metal layer, a second first conductivity type contact region serves as a drain terminal and is located at a second side of the first conductivity type region and connected to the metal layer, a gate terminal is located above a thin dielectric layer and below a pre-metal dielectric layer, the metal layer is isolated with the gate terminal through the dielectric layer in front of the metal layer;

the PNP device is arranged in a first conductivity type region and below a pre-metal dielectric layer, a collector terminal of a first conductivity type contact region is located in the first conductivity type region, an emitter terminal of the first conductivity type contact region and a base terminal of a second conductivity type contact region are located in a base region of a second conductivity type buffer region, the second conductivity type buffer region is located in the first conductivity type region, the collector terminal of the first conductivity type contact region, the emitter terminal of the first conductivity type contact region, and the base terminal of the second conductivity type contact region are all connected to the metal layer;

the diode device is arranged in a first conductivity type region and below a pre-metal dielectric layer, an anode of a first conductivity type contact region is located in the first conductivity type region, a cathode of a second conductivity type contact region is located in the first conductivity type region, the anode of the first conductivity type contact region and the cathode of the second conductivity type contact region are connected to the metal layer.

3. The BCD semiconductor device according to claim 2, wherein the second conductivity type buried layer above the dielectric of the first high voltage nLIGBT device, the second high voltage nLIGBT device, the first high voltage nLDMOS device, the second high voltage nLDMOS device, the third high voltage nLDMOS device, the first high voltage pLDMOS device is replaced with first conductivity type voltage withstanding structures, and the first conductivity type voltage withstanding structures are connected to the first conductivity type implanted region on side walls of the dielectric trenches of the first high voltage nLIGBT device, the second high voltage nLIGBT device, the first high voltage nLDMOS device, the second high voltage nLDMOS device, the third high voltage nLDMOS device, the first high voltage pLDMOS device.

4. The BCD semiconductor device according to claim 2, wherein each of the first conductivity type implanted regions on left and right sides of side walls of the dielectric trenches of the first high voltage nLIGBT device, the second high voltage nLIGBT device, the first high voltage nLDMOS device, the second high voltage nLDMOS device, the third high voltage nLDMOS device, and the first high voltage pLDMOS device is replaced with a second conductivity type dielectric electric field enhancement structure.

5. The BCD semiconductor device according to claim 2, wherein the each of first conductivity type implanted regions on left and right sides of the side walls of the dielectric trenches of the first high voltage nLIGBT device, the second high voltage nLIGBT device, the first high voltage nLDMOS device, the second high voltage nLDMOS device, the third high voltage nLDMOS device, and the first high voltage pLDMOS device are replaced with a second conductivity type dielectric electric field enhancement structure, and the second conductivity type buried layers above the dielectrics are replaced with a first conductivity type voltage withstanding structure.

6. The BCD semiconductor device according to claim 2, wherein for a structure of the multi-channel emitter terminal of the first high voltage nLIGBT device and a structure of the multi-channel source terminals of the first high voltage nLDMOS device, the second high voltage nLDMOS device, the third high voltage nLDMOS device, and the source terminal of the first high voltage pLDMOS device, when a device selected from the group consisting of the first high voltage nLIGBT device, the first high voltage nLDMOS device, the second high voltage nLDMOS device, the third high voltage nLDMOS device, and the first high voltage pLDMOS device ends with the $n^{th}$ left cell 2 ($n$) at an edge, a number of channels is 2n+1; when n=0, the device is a single-channel device; when the device ends with the $n^{th}$ right cell 1 ($n$) at the edge, the number of the channels is 2n and n≥1; for a structure of the emitter terminal of the second high voltage nLIGBT device, when the second high voltage nLIGBT device ends with the $n^{th}$ left cell 2 ($n$) at the edge, the number of the channels is 2n and n≥1, when the second high voltage nLIGBT device ends with the $n^{th}$ right cell 1 ($n$) at the edge, the number of channels is 2n+1, and when n=0, the device is the single-channel device.

7. The BCD semiconductor device according to claim 2, wherein a structure of the emitter terminals of the first high voltage nLIGBT device and the second high voltage nLIGBT device and a structure of the source terminals of the third high voltage nLDMOS device and the first high voltage pLDMOS device further comprise second conductivity type implanted regions located between thin dielectric layers of the first high voltage nLIGBT device, the second high voltage nLIGBT device, the third high voltage nLDMOS device and the first high voltage pLDMOS device and upper surfaces of the second conductivity type well regions of the first high voltage nLIGBT device, the second high voltage nLIGBT device, the third high voltage nLDMOS device and the first high voltage pLDMOS device.

8. The BCD semiconductor device according to claim 2, wherein no left cell 2 (0) is in a structure of the emitter terminal of the first high voltage nLIGBT device and a structure of the source terminals of the first high voltage nLDMOS device, the second high voltage nLDMOS device, the third high voltage nLDMOS device, and the first high voltage pLDMOS device.

9. The BCD semiconductor device according to claim 2, wherein no second conductivity type well region is in the first high voltage nLIGBT device, the second high voltage nLIGBT device, the first high voltage nLDMOS device, the second high voltage nLDMOS device, and the third high voltage nLDMOS device.

10. The BCD semiconductor device according to claim 2, wherein the first high voltage nLIGBT device, the second high voltage nLIGBT device, the first high voltage nLDMOS device, the second high voltage nLDMOS device, the third high voltage nLDMOS device, and the first high voltage pLDMOS device have no first conductivity type implanted region on two sides of the dielectric trench and no second conductivity type buried layer above the dielectric.

11. The BCD semiconductor device according to claim 2, wherein the filler in the dielectric trenches of the first high voltage nLIGBT device, the second high voltage nLIGBT device, the first high voltage nLDMOS device, the second high voltage nLDMOS device, the third high voltage nLDMOS device, and the first high voltage pLDMOS device is polysilicon, silicon dioxide, or air.

12. The BCD semiconductor device according to claim 2, wherein when the first conductivity type regions and the second conductivity type well regions of the first high voltage nLIGBT device, the second high voltage nLIGBT device, the first high voltage nLDMOS device, the second high voltage nLDMOS device, the third high voltage nLDMOS device, and the first high voltage pLDMOS device contact the substrate or the dielectrics of the first high voltage nLIGBT device, the second high voltage nLIGBT device, the first high voltage nLDMOS device, the second high voltage nLDMOS device, the third high voltage nLDMOS device, and the first high voltage pLDMOS device, the first high voltage nLIGBT device, the second high voltage nLIGBT device, the first high voltage nLDMOS device, the second high voltage nLDMOS device, the third high voltage nLDMOS device, and the first high voltage pLDMOS device are single-channel devices.

13. The BCD semiconductor device according to claim 2, wherein the high voltage devices are arranged inside a dielectric island, or the low voltage devices are arranged inside an isolation island in a manner of dielectric isolation.

14. The BCD semiconductor device according to claim 2, wherein the gate terminal has a trench gate structure.

15. A method for manufacturing the BCD semiconductor device according to claim 2, comprising:
   step 1, implanting oxygen ions with a predetermined amount into the substrate through a photolithography technique and an ion implantation technique, then performing an annealing treatment to form the dielectric;
   step 2, implanting second conductivity type impurities into the substrate through the photolithography technique and the ion implantation technique;
   step 3, performing an epitaxy to form the second conductivity type epitaxial layer, meanwhile, forming the second conductivity type buried layer above the dielectric in a high temperature process of the epitaxy;
   step 4, etching a deep trench after a shield layer is etched on an upper electrode of the second conductivity type epitaxial layer through the photolithography technique and an etching technique, and forming the first conductivity type implanted region on a side wall of the deep trench in a manner of inclined angle implantation;
   step 5, thermally growing an oxide layer on a side wall of the trench and an upper surface of the second conductivity type epitaxial layer, forming the dielectric trench, depositing a polysilicon to fill remaining gaps in the deep trench, removing the polysilicon on the upper surface of the second conductivity type epitaxial layer, and forming an active region after the photolithography technique and the etching technique;
   step 6, respectively implanting first conductivity type impurities and the second conductivity type impurities into the second conductivity type epitaxial layer by different energies through the photolithography technique and the ion implantation technique, then performing the annealing treatment to form the first conductivity type region and the second conductivity type well region;
   step 7, forming the active region by photolithographing, and thermally growing the field oxide layer on the upper surface of the second conductivity type epitaxial layer;
   step 8, implanting the second conductivity type impurities into the second conductivity type epitaxial layer through the photolithography technique and the ion implantation technique, then performing the annealing treatment to form the second conductivity type buffer region;
   step 9, forming the thin dielectric layer through a thermal oxidation growth, depositing the polysilicon, and performing the photolithography technique and the ion implantation technique, to form the first conductivity type contact region and the second conductivity type contact region;
   step 10, depositing the dielectric layer in front of the metal layer, and depositing the metal layer after punching.

16. The method for manufacturing the BCD semiconductor device according to claim 15, wherein
   an annealing process is added between step 3 and step 4 to ensure a formation of the second conductivity type buried layer, in step 6, the deep trench is filled through a method of deposition first, and a growth of the field oxide layer is performed subsequently.

17. A BCD semiconductor device comprising a plurality of devices integrated on a single chip, wherein the plurality of devices comprise a third high voltage nLIGBT device, a fourth high voltage nLDMOS device, a fifth high voltage nLDMOS device, a sixth high voltage nLDMOS device, a second high voltage pLDMOS device, a second low voltage PMOS device, a second low voltage NMOS device, a NPN device, a second PNP device, and a second diode device;
   wherein a dielectric isolation is applied to the third high voltage nLIGBT device, the fourth high voltage nLDMOS device, the fifth high voltage nLDMOS device, the sixth high voltage nLDMOS device, and the second high voltage pLDMOS device to realize a complete isolation between the high voltage devices and the low voltage devices.

18. The BCD semiconductor device according to claim 17, wherein the third high voltage nLIGBT device is located in a first isolation region, the first isolation region comprises a dielectric, a first conductivity type voltage withstanding structure, a dielectric trench, a filler, and a first conductivity type implanted region; wherein the dielectric is located in a substrate, the dielectric trench is located in a first conductivity type epitaxial layer, the dielectric trench extends to the substrate and is connected to the dielectric to form a complete isolation, the first conductivity type implanted region is located on each side of the dielectric trench, the filler is located in a middle of the dielectric trench, and the first conductivity type voltage withstanding structure is located above the dielectric; the third high voltage nLIGBT device further comprises a second conductivity type well region located in the first conductivity type epitaxial layer, wherein the second conductivity type well region serves as a drift region; a second conductivity type buffer region located in the second conductivity type well region, wherein the second conductivity type buffer region serves as a field stop region; a first first conductivity type contact region located in a second conductivity type buffer region and connected to a metal layer, wherein the first conductivity type contact region serves as a collector terminal; a field oxide layer located above the second conductivity type well region; a gate terminal and a thin dielectric layer located on a side of the field oxide layer near an emitter terminal, and on an upper surface of the first conductivity type region; a second first conductivity type contact region and a second conductivity type contact region located on a side of the gate terminal far away from the field oxide layer and connected to the metal layer, the metal layer is isolated with the gate terminal through a pre-metal dielectric layer;

the fourth high voltage nLDMOS device is located in a second isolation region, wherein the second isolation region comprises a dielectric, a first conductivity type voltage withstanding structure, a dielectric trench, a filler, and a first conductivity type implanted region; wherein the dielectric is located in a substrate, a dielectric trench is located in the first conductivity type epitaxial layer, the dielectric trench extends to the substrate and is connected to the dielectric to form a complete isolation, a first conductivity type implanted region is located on each side of the dielectric trench, the filler is located in the middle of the dielectric trench, the first conductivity type voltage withstanding structure is located above the dielectric; the fourth high voltage nLDMOS device further comprises a second conductivity type well region located in the first conductivity type epitaxial layer, wherein the second conductivity type well region serves as a drift region; a second conductivity type buffer region located in a second conductivity type well region, wherein the second conductivity type buffer region serves as a field stop region; a first second conductivity type contact region located in a second conductivity type buffer region and connected to a metal layer, wherein the first second conductivity type contact region serves as a drain terminal; a field oxide layer located above the second conductivity type well region; a gate terminal and a thin dielectric layer located on a side of the field oxide layer near a source terminal and on an upper surface of a first conductivity type region; a first conductivity type contact region and a second second conductivity type contact region located on a side of the gate terminal far away from the field oxide layer and connected to the metal layer; the metal layer is isolated with the gate terminal through a pre-metal dielectric layer;

the fifth high voltage nLDMOS device is different from the fourth high voltage nLDMOS device in that the second conductivity type implanted region of the fifth high voltage nLDMOS device is located on an upper surface of the first conductivity type region of the fifth high voltage nLDMOS device, and the gate terminal and the thin dielectric layer are located on an upper surface of the second conductivity type implanted region of the fifth high voltage nLDMOS device;

the sixth high voltage nLDMOS device is different from the fourth high voltage nLDMOS device in that no field oxide layer is arranged above the second conductivity type well region of the sixth high voltage nLDMOS device;

the second high voltage pLDMOS device is located in a third isolation region, wherein third isolation region comprises a dielectric, a second conductivity type buried layer, a dielectric trench, a filler, and a first conductivity type implanted region; the dielectric is located in a substrate, a dielectric trench is located in the first conductivity type epitaxial layer, the dielectric trench extends to the substrate and is connected to the dielectric to form a complete isolation, the first conductivity type implanted region is located on each side of the dielectric trench, the filler is located in a middle of the dielectric trench, the second conductivity type buried layer is located above the dielectric; the second high voltage pLDMOS device further comprises a first first conductivity type contact region located in the first conductivity type epitaxial layer and connected to a metal layer, wherein the first first conductivity type contact region serves as a drain terminal; a gate terminal and a thin dielectric layer located on an upper surface of a second conductivity type well region; a field oxide layer located on an upper surface of the first conductivity type epitaxial layer and between the second conductivity type well region and the first first conductivity type contact region; a second first conductivity type contact region and a second conductivity type contact region located on a side of the gate terminal far away from the field oxide layer and respectively connected to the metal layer, the metal layer is isolated with the gate terminal through a pre-metal dielectric layer;

the second low voltage PMOS device is arranged in a second conductivity type well region, and the second conductivity type well region is located in the first conductivity type epitaxial layer, a second conductivity type contact region and a first first conductivity type contact region are respectively connected to a metal layer to serve as source terminals and are located on a first side inside the second conductivity type well region, a second first conductivity type contact region is connected to a metal layer to serve as a drain terminal, a gate terminal on a second side inside the second conductivity type well region is located above a thin dielectric layer and below a pre-metal dielectric layer, the metal layer are isolated from the gate terminal through the dielectric layer in front of the metal layer;

the second low voltage NMOS device is arranged inside a first conductivity type region, and the first conductivity type region is located in the first conductivity type epitaxial layer, a second conductivity type contact region and a first first conductivity type contact region are respectively connected to a metal layer to serve as source terminals and are located on a first side inside the first conductivity type region, a second second conductivity type contact region is connected to the metal layer to serve as a drain terminal and is located on a second side inside the first conductivity type region, the gate terminal is located above a thin dielectric layer and below a pre-metal dielectric layer, the gate terminal is isolated with the metal layer through the dielectric layer in front of the metal layer;

the NPN device is arranged in a second conductivity type well region and below a pre-metal dielectric layer, a collector terminal of a second conductivity type contact region is located in the second conductivity type well region, an emitter terminal of the second conductivity type contact region and a base terminal of a first conductivity type contact region are located in a base region of a first conductivity type region; wherein the emitter terminal of the second conductivity type contact region, the collector terminal of the second conductivity type contact region, and the base terminal of the first conductivity type contact region are all connected to the metal layer;

the second PNP device is arranged in the first conductivity type epitaxial layer and below a pre-metal dielectric layer, a collector terminal and an emitter terminal of a first conductivity type contact region are located in a first conductivity type region, respectively, a base terminal of a second conductivity type contact region is located in a base region of a second conductivity type well region, the first conductivity type region is also located in the second conductivity type well region, the collector terminal of the first conductivity type contact region, the emitter terminal of the first conductivity type contact region, and the base terminal of the second conductivity type region are all connected to the metal layer;

the second diode device is arranged in a second conductivity type well region and below a pre-metal dielectric layer, an anode of a first conductivity type contact region is located in a second conductivity type well region and a cathode of a second conductivity type contact region is also located in the second conductivity type well region, the anode of the first conductivity type contact region and the cathode of the second conductivity type contact region are connected to the metal layer.

19. A method for manufacturing the BCD semiconductor device according to claim 18, comprising:

Step 1, implanting oxygen ions with a predetermined amount into the substrate and then performing an annealing treatment to form the dielectric, by using a photolithography technique and an ion implantation technique;

Step 2, implanting first conductivity type impurities into the substrate through the photolithography technique and the ion implantation technique;

Step 3, performing an epitaxy to form the first conductivity type epitaxial layer, meanwhile, forming the first conductivity type voltage withstanding structure above the dielectric in a high temperature annealing process;

Step 4, etching a deep trench after a shield layer is etched on an upper electrode of the second conductivity type epitaxial layer through the photolithography technique and an etching technique, and forming the first conductivity type implanted region on a side wall of the deep trench in a manner of inclined angle implantation:

Step 5, thermally growing the oxide layer on the side wall of the deep trench and an upper surface of the first conductivity type epitaxial layer, forming the dielectric trench, depositing a polysilicon to fill remaining gaps in the deep trench, and removing polysilicon and oxide layer on an upper surface of the second conductivity type epitaxial layer by CMP;

Step 6, respectively implanting first conductivity type impurities and second conductivity type impurities into the first conductivity type epitaxial layer by different energies through the photolithography technique and the ion implantation technique, then performing the annealing treatment to form the first conductivity type region and the second conductivity type well region;

Step 7, forming an active region by photolithographing, and thermally growing the oxide layer on the upper surface of the first conductivity type epitaxial layer to form the field oxide layer and removing a photoresist;

Step 8, implanting the second conductivity type impurities into the first conductivity type epitaxial layer and then performing an annealing treatment to form a second conductivity type buffer region, through the photolithography technique and the ion implantation technique, forming the thin dielectric layer through a thermal oxidation growth, forming the gate terminal by deposition, and performing a photoetching;

Step 9, performing the photolithography technique and the ion implantation technique to form the first conductivity type contact region and the second conductivity type contact region;

Step 10, depositing the dielectric layer in front of the metal layer, and depositing the metal layer after punching.

20. The method for manufacturing the BCD semiconductor device according to claim 19, wherein, an annealing process is added between step 3 and step 4 to ensure a formation of the first conductivity type voltage withstanding structure, in step 6, the deep trench is filled in the method of deposition first, and a growth of the field oxide layer is performed, subsequently.

* * * * *